US008669626B2

(12) United States Patent
Tanaka et al.

(10) Patent No.: US 8,669,626 B2
(45) Date of Patent: Mar. 11, 2014

(54) OPTICAL SENSOR, OPTICAL SENSOR ARRAY, OPTICAL SENSOR DRIVING METHOD, AND OPTICAL SENSOR ARRAY DRIVING METHOD

(75) Inventors: Atsushi Tanaka, Kanagawa (JP); Takeshi Hama, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 681 days.

(21) Appl. No.: 12/952,979

(22) Filed: Nov. 23, 2010

(65) Prior Publication Data

US 2011/0127410 A1   Jun. 2, 2011

(30) Foreign Application Priority Data

Dec. 1, 2009   (JP) .................. 2009-273769

(51) Int. Cl.
*H01L 27/14* (2006.01)

(52) U.S. Cl.
USPC ........... 257/414; 257/431; 257/432; 257/461; 257/462

(58) Field of Classification Search
USPC .......................... 257/414, 431, 432, 461, 462
See application file for complete search history.

(56) References Cited

U.S. PATENT DOCUMENTS

| 2006/0118875 A1* | 6/2006 | Nakagawa et al. ............ 257/351 |
| 2009/0072122 A1 | 3/2009 | Tada et al. |
| 2010/0276738 A1 | 11/2010 | Matsushima et al. |
| 2012/0299113 A1* | 11/2012 | Endo et al. .................... 257/369 |
| 2013/0122634 A1 | 5/2013 | Matsushima et al. |

FOREIGN PATENT DOCUMENTS

| JP | 5-48142 A | 2/1993 |
| JP | 5-206496 A | 8/1993 |
| JP | 2006-32564 A | 2/2006 |
| JP | 2006-165530 A | 6/2006 |
| JP | 2007-103591 A | 4/2007 |
| JP | 2009-71057 A | 4/2009 |
| WO | 2009/078299 A1 | 6/2009 |

OTHER PUBLICATIONS

Nomura et al., "Room-Temperature Fabrication of Transparent Flexible Thin-Film Transistors Using Amorphous Oxide Semiconductors", Nature, vol. 432, pp. 488-492, Nov. 25, 2004.
Nomura et al., "Thin-Film Transistor Fabricated in Single-Crystalline Transparent Oxide Semiconductor", Science, vol. 300, pp. 1269-1272, May 23, 2003.
Corresponding Japanese Office Action dated Aug. 13, 2013, with the Partial English Translation.

* cited by examiner

*Primary Examiner* — Jae Lee
(74) *Attorney, Agent, or Firm* — Birch, Stewart, Kolasch & Birch, LLP

(57) ABSTRACT

An optical sensor that is a transistor which includes a gate electrode including a semiconductor material where the carrier concentration is $1.0 \times 10^{14}/cm^3$ to $1.0 \times 10^{17}/cm^3$, an active layer including a semiconductor layer to form a channel by carriers of the same type as the gate electrode, a source electrode, a drain electrode, and a gate insulating film, wherein intensity of irradiated light is detected by a change in a value of current flowing between the source electrode and the drain electrode when the light is irradiated onto a depletion layer formed in the gate electrode; an optical sensor array, an optical sensor driving method, and an optical sensor array driving method are provided.

18 Claims, 15 Drawing Sheets

OPTICAL SENSOR, OPTICAL SENSOR ARRAY, OPTICAL SENSOR DRIVING METHOD, AND OPTICAL SENSOR ARRAY DRIVING METHOD

CROSS-REFERENCE TO RELATED APPLICATION

This application claims priority under 35 USC 119 from Japanese Patent Application No. 2009-273769, filed on Dec. 1, 2009, the disclosure of which is incorporated by reference herein.

BACKGROUND OF THE INVENTION

1. Field of the Invention

The present invention relates to an optical sensor, an optical sensor array, an optical sensor driving method, and an optical sensor array driving method.

2. Description of the Related Art

Photoelectric conversion elements using a semiconductor material such as silicon (Si) are applied to optical sensors.

In the operation of the photoelectric conversion elements that are used as the optical sensors, an electric field is applied to a PN junction or a MOS (Metal Oxide Semiconductor) structure to form a depletion layer, the formed depletion layer is exposed to light so that electron-hole pairs are generated, the electron-hole pairs are extracted as a signal, and the intensity of the light irradiated onto the depletion layer is detected.

Among these photoelectric conversion elements, a photodiode using a PN junction is most generally used. However, a phototransistor that amplifies a photocurrent is sometimes used to obtain higher sensitivity.

The conventional photoelectric conversion element is typically structured such that incident light passes through a semiconductor layer made of silicon and an electrode layer prior to arrival at the depletion layer. During the traveling, the light with short-wavelengths is particularly absorbed in these layers. For this reason, problems such as a decrease in sensitivity and an increase in wavelength dependence arise.

As a technology related to a Complementary Metal Oxide Semiconductor (CMOS) image sensor including a photodiode having a PN junction, a technology for improving efficiency of the CMOS image sensor using a transparent electrode (ITO: Indium Tin Oxide) is studied (for example, refer to Japanese Patent Application Laid-Open (JP-A) No. 2007-103591).

Further, In—Ga—Zn—O-based oxide materials (hereinafter, simply referred to as "IGZO") has attracted attention as an active layer of a thin film transistor (TFT) showing higher mobility than amorphous silicon (a-Si) since a report made by a group of Professor Hideo Hosono, et. al. of Tokyo Institute of Technology (for example, refer to Science, 300 (2003) 1269 and Nature, 432 (2004) 488). Also, a visible light sensor using the IGZO has been reported (for example, JP-A No. 2006-165530).

SUMMARY OF THE INVENTION

The present invention has been made and provides optical sensor, optical sensor array, optical sensor driving method, and optical sensor array driving method.

A first aspect of the present invention provides an optical sensor that is a transistor which includes a gate electrode comprising a semiconductor material where the carrier concentration of from $1.0 \times 10^{14}/cm^3$ to $1.0 \times 10^{17}/cm^3$, an active layer comprising a semiconductor layer to form a channel by carriers of the same type as the gate electrode, a source electrode, a drain electrode, and a gate insulating film, wherein intensity of irradiated light is detected by a change in a value of current flowing between the source electrode and the drain electrode when the light is irradiated onto a depletion layer formed at the gate electrode.

A second aspect of the present invention provides an optical sensor array that includes a plurality of optical sensors according to the first aspect of the invention are disposed in a matrix A third aspect of the present invention provides an optical sensor array, including: a blue light-detecting optical sensor that detects blue light; a blue color filter that is provided on a light incident side of the blue light-detecting optical sensor; a green light-detecting optical sensor that detects green light; a green color filter that is provided on a light incident side of the green light-detecting optical sensor; a red light-detecting optical sensor that detects red light; and a red color filter that is provided on a light incident side of the red light-detecting optical sensor, wherein the blue light-detecting optical sensor, the green light-detecting optical sensor, and the red light-detecting optical sensor are each an optical sensor according to the first aspect of the present invention and are disposed in a matrix.

A fourth aspect of the present invention provides an optical sensor driving method that drives the optical sensor of the first aspect of the present invention, including: applying a first bias between a source electrode and a drain electrode; applying a second bias which is a pulsed voltage to the gate electrode; and detecting intensity of irradiated light by measuring a difference between values of currents flowing between the source electrode and the drain electrode, when the light is irradiated and when the light is not irradiated.

A fifth aspect of the present invention provides an optical sensor array driving method that drives the optical sensor array of the second aspect or the third aspect of the invention, including: applying a first bias between the source electrode and the drain electrode; applying a second bias which is a pulsed voltage to the gate electrode; and detecting intensity of irradiated light by measuring a difference between values of currents flowing between the source electrode and the drain electrode, when the light is irradiated and when the light is not irradiated.

DETAILED DESCRIPTION OF THE INVENTION

Optical Sensor

Figure 1:
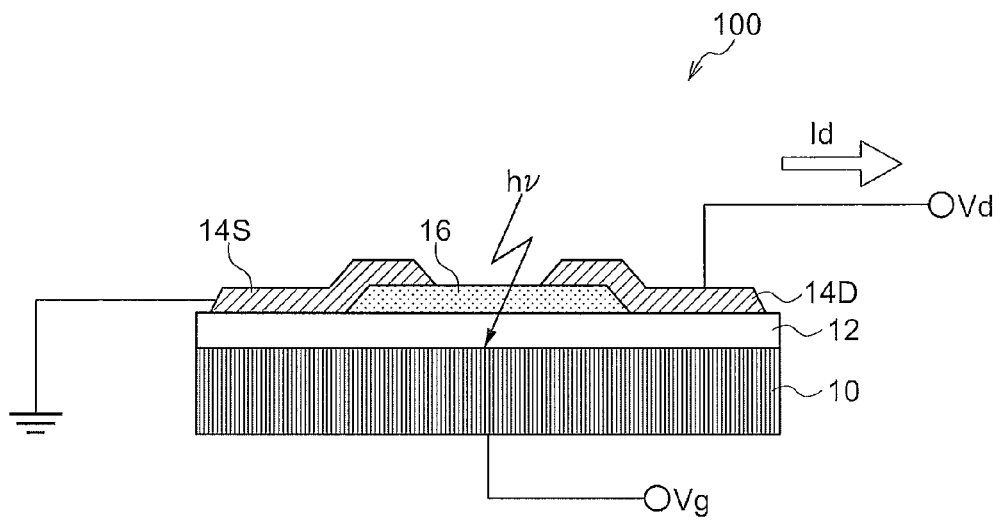
FIG. 1 is a schematic structural view illustrating an example of an optical sensor according to an aspect of the present invention.

An optical sensor according to an aspect of the present invention is a transistor that has a gate electrode including a semiconductor material where a carrier concentration is from $1.0 \times 10^{14}/cm^3$ to $1.0 \times 10^{17}/cm^3$, an active layer including a semiconductor layer to form a channel with carriers of the same type as the gate electrode, a source electrode, a drain electrode, and a gate insulating film. The optical sensor detects an intensity of irradiated light by a change in a value of a current (hereinafter, referred to as "drain current") flowing between the source electrode and the drain electrode, when the light is irradiated onto a depletion layer formed in the gate electrode.

In most of the conventional optical sensors using a PN junction or a Metal Oxide Semiconductor (MOS) structure, an electric field is applied to the PN junction or the MOS structure to form a depletion layer, light is irradiated onto the formed depletion layer to generate charges (electron-hole pairs), the generated charges are extracted as a signal, and the intensity of the irradiated light is detected.

Meanwhile, in the optical sensor according to an aspect of the invention, light is irradiated onto the depletion layer formed in the gate electrode to generate charges (electron-hole pairs), the generated charges are not directly extracted as a signal as it is but the drain current that is amplified by generation of the charges is extracted as a signal, and the intensity of the irradiated light is detected.

From study made by the inventors, it becomes clear that, a signal having a large magnitude may be extracted for the light having the same intensity (that is, sensitivity is greatly improved), in the optical sensor according to an aspect of the invention having the above structure, as compared with the conventional optical sensor. For example, a sensitivity of the conventional silicon photodiode is 251 mA/W with respect to the light having a wavelength of 500 nm. Meanwhile, a sensitivity is 523000 mA/W with respect to the light having a wavelength of 500 nm, according to one of examples to be described below.

As such, the optical sensor according to an aspect of the invention amplifies a signal based on light irradiation by a structure and an operation principle which have not been used in conventional technique, and detects the amplified signal.

For the conventional optical sensor, there has been a method of improving sensitivity. According to the method, the optical sensor is provided with a MOS capacitor and a Metal Oxide Semiconductor Field Effect Transistor (MOS-FET) that are adjacent to each other, charges are generated by the MOS capacitor, a signal based on the generated charges is amplified by the adjacent MOS-FET, and thus the amplified signal is obtained.

Meanwhile, in the optical sensor according to an aspect of the invention, since functions of from receiving of light to amplifying can be executed by a single transistor (for example, MOS-FET), an element arrangement area can be reduced as compared with the conventional optical sensor including the MOS capacitor and the MOS-FET disposed adjacent to each other. For this reason, in an optical sensor array where plural optical sensors (transistors) is disposed in a matrix, the optical sensors may be disposed with a higher numerical aperture (=higher efficiency) or a higher density. Therefore, a high-quality optical sensor array may be realized.

Since the optical sensor according to an aspect of the invention does not need to form a PN junction, the optical sensor may be manufactured using a simple method and is superior in terms of productivity (cost).

Next, an example of the optical sensor according to an aspect of the invention will be described with reference to FIG. 1.

FIG. 1 is a schematic structural view of an optical sensor 100 that is an example of the optical sensor according to an aspect of the invention.

The optical sensor 100 is configured as a bottom gate type transistor, which has a gate electrode 10 including an n-type region formed on an Si substrate where a carrier concentration of the n-type region is $1.0 \times 10^{14}/cm^3$ to $1.0 \times 10^{17}/cm^3$ (or the gate electrode being an n-type silicon substrate having the same carrier concentration as above), a gate insulating film 12 which is an $SiO_2$ film provided on the gate electrode 10, an active layer 16 including an n-type semiconductor film provided on the gate insulating film 12, and a source electrode 14S and a drain electrode 14D that are provided on the gate insulating film 12 and the active layer 16.

The gate electrode 10 is connected to a power supply for applying a gate bias (gate voltage) Vg, and the drain electrode 14D is connected to a power supply for applying a drain bias (drain voltage) Vd. The source electrode 14S is connected to a ground (grounded).

As for light hv with respect to heading for the optical sensor 100, it may be irradiated in a direction toward the active layer 16 from the outer side of the gate electrode 10. Alternatively, as shown in FIG. 1, the light is preferably irradiated in a direction toward the gate electrode 10 from the outer side of the active layer 16. That is, light that is transmitted through the active layer 16 and the gate insulating film 12 is preferably irradiated onto the gate electrode 10.

The light that is transmitted through the active layer 16 and the gate insulating film 12 is irradiated onto the gate electrode 10, charges (electron-hole pairs) that are generated by the incident light is not directly extracted as a signal current, but the charges are used to cause a change in gate capacitance of the transistor, and as a result, a variation of the drain current, that is an amplified signal, is extracted. Therefore, sensitivity is further improved.

The optical sensor 100 may include other elements if necessary. For example, a protective film ($SiO_2$ film, $SiN_x$ film, organic interlayer film, or the like) (although not shown in the drawings) may be formed on the transistor.

Next, the operation of detecting light by the optical sensor 100 will be described with reference to the schematic structural view of FIG. 1 and the energy band view of FIG. 2. However, the invention is not limited by the following description.

Figure 2:
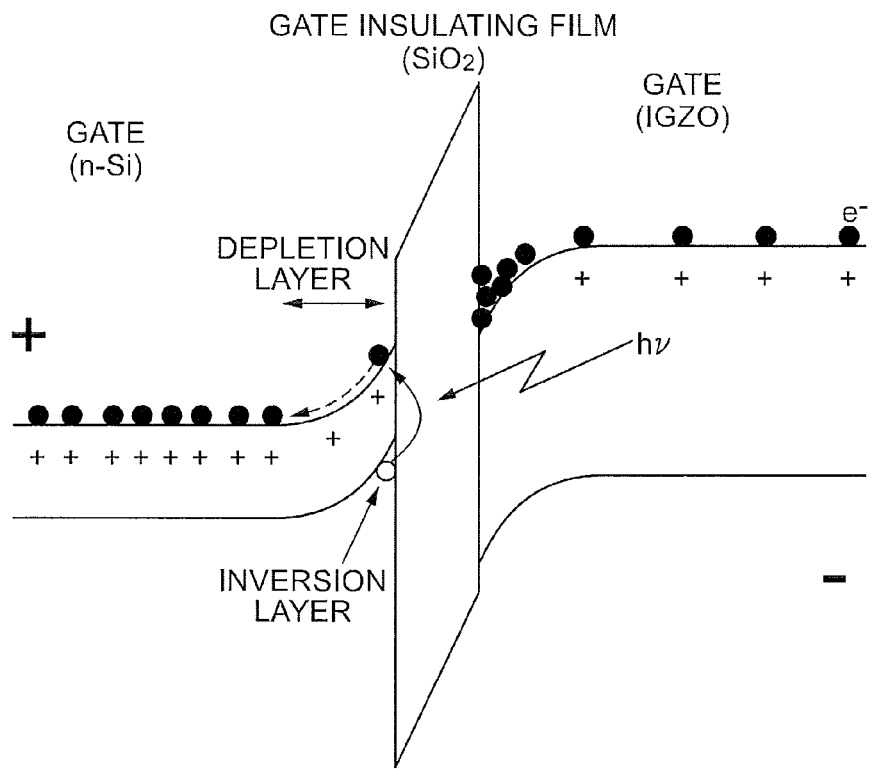
FIG. 2 is a schematic view illustrating an energy band in an example of an optical sensor according to an aspect of the invention.

FIG. 2 is an energy band view in which the gate electrode 10, gate insulating film 12, and active layer 16 of the optical sensor 100 shown in FIG. 1 are represented by a "gate (n-Si)," a "gate insulating film ($SiO_2$)," and a "channel (IGZO)," respectively. In FIG. 2, solid (black) circles represent electrons, and signs "+" and a blank (white) circle represent holes.

In the operation of detecting light by the optical sensor 100, first a positive drain bias Vd is applied to the drain electrode 14D of the optical sensor 100 (source electrode 14S is connected to a ground).

Next, when a positive gate bias Vg having a sufficient value or more is applied to the gate electrode 10, a depletion layer is formed in the gate electrode 10, particularly in the vicinity of the interface with the gate insulating film. In the optical sensor 100, since the carrier concentration of the gate electrode 10 is relatively low, such as $1.0 \times 10^{14}/cm^3$ to $1.0 \times 10^{17}/cm^3$, an inversion layer is not formed for a long time (for example, several tens of seconds to several minutes at room temperature), and the depletion layer is maintained as it is. Due to such a depletion layer, there is obtained an effect such that a thickness of the gate insulating film appears as if it is increased, and the gate capacitance (capacitance between the active layer 16 and the gate electrode 10) is decreased.

Next, when the light hv is irradiated onto the depletion layer, charges (electron-hole pairs) are generated in the depletion layer. Among the generated electron-hole pairs, electrons near the interface with the gate insulating film move in a direction away from the interface (in a direction of an arrow of a broken line in FIG. 2), and an inversion layer is formed on the interface in the form where only the holes remain. As the result of the formation of the inversion layer, the gate capacitance returns to the original capacitance, and the drain current Id is greatly increased due to this action.

Accordingly, when an increase in the drain current Id (or a ratio of "drain current Id at the time of irradiation/drain current Id at the time of non-irradiation") is measured, the irradiated light hv may be detected with high sensitivity.

An example where the above phenomenon is experimentally confirmed is shown in examples 1 and 2 (refer to FIGS. 4 to 7) to be described below.

As such, in the optical sensor 100, it is assumed that the sensitivity with respect to the irradiated light is improved when the depletion layer is formed in the gate electrode and the inversion layer is formed by irradiated light. However, the invention is not limited by the above assumption.

The optical sensor 100 has a combination where the gate electrode 10 is an n-type semiconductor and the active layer 16 is an n-type semiconductor (that is, combination where a majority of carriers are electrons). However, the invention is not limited to this form but may have a combination where the gate electrode 10 is a p-type semiconductor and the active layer 16 is a p-type semiconductor (that is, combination where a majority of carriers are holes). That is, in the invention, the active layer may be a semiconductor layer where the channel is formed by carriers of the same type as the gate electrode.

In the case of the combination where the gate electrode 10 is a p-type semiconductor and the active layer 16 is a p-type semiconductor, a negative bias is applied to each of the gate electrode 10 and the drain electrode 14D.

As the example of the optical sensor according to an aspect of the invention, the optical sensor that is the bottom gate type transistor is described. However, the optical sensor according to an aspect of the invention is not limited to this form. For example, the optical sensor of the invention may be a top gate type transistor.

Figure 3:
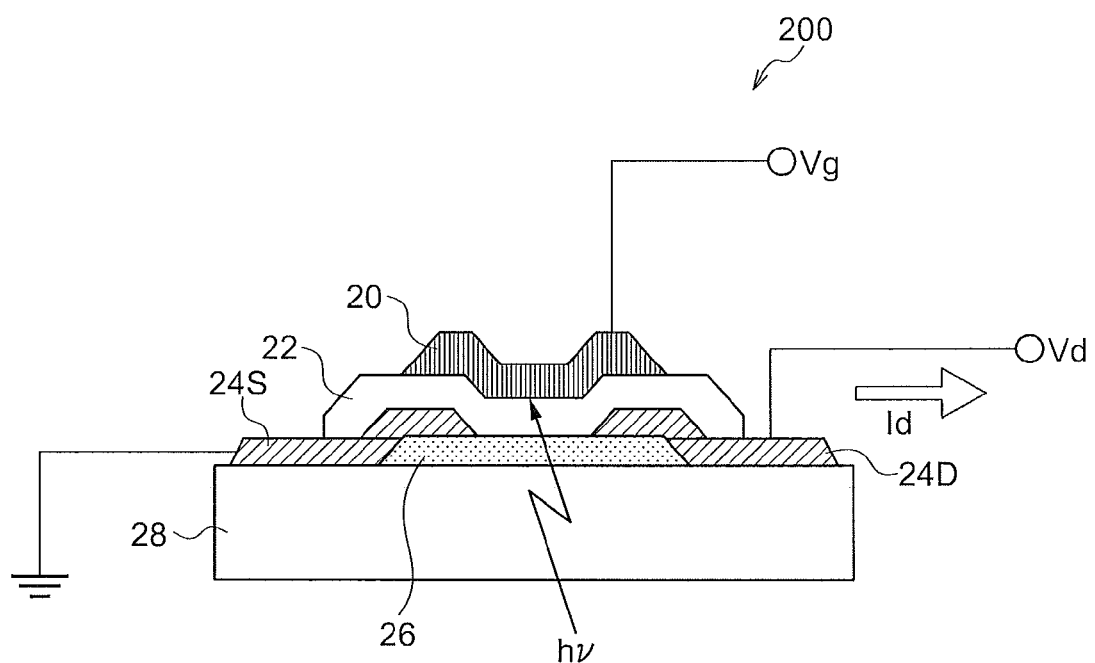
FIG. 3 is a schematic structural view illustrating another example of an optical sensor according to an aspect of the invention.

FIG. 3 is a schematic structural view of an optical sensor 200 which is a top gate type transistor that is another example of the optical sensor according to another aspect of the invention.

The optical sensor 200 shown in FIG. 3 is configured as a top gate type transistor, which has a substrate 28 such as a glass substrate, an active layer 26 including an n-type semiconductor provided on the substrate 28, a source electrode 24S and a drain electrode 24D that are provided on the substrate 28 and the active layer 26, a gate insulating film 22 that is provided on the source electrode 24S, the drain electrode 24D, and the active layer 26, and a gate electrode 20 including an n-type semiconductor formed on the gate insulating film 22 where a carrier concentration of the n-type semiconductor is $1.0 \times 10^{14}/cm^3$ to $1.0 \times 10^{17}/cm^3$.

The gate electrode 20 is connected to a power supply for applying a gate bias Vg and the drain electrode 24D is connected to a power supply for applying a drain bias Vd. The source electrode 24S is connected to a ground.

The optical sensor 200 has a combination where the gate electrode 20 is an n-type semiconductor and the active layer 26 is an n-type semiconductor (that is, combination where a majority of carriers are electrons). However, the invention is not limited to this form, but may have a combination where the gate electrode 20 is a p-type semiconductor and the active layer 26 is a p-type semiconductor (that is, combination where a majority of carriers are holes).

Upon manufacturing the optical sensor according to an aspect of the invention (during or after manufacturing of the optical sensor), a transistor characteristic is preferably adjusted by heating treatment.

In this way, a ratio of "a drain current Id at the time of irradiation to a drain current Id at the time of no-irradiation" may be improved and the sensitivity may be improved.

The heating temperature during the heating treatment depends on a type of a semiconductor layer functioning as the gate electrode or the active layer. For example, the heating treatment is performed at the temperature of 100° C. to 1000° C. (preferably 150° C. to 500° C.).

As a heating time during the heating treatment, when the heat treatment is performed using a hot plate or a furnace (clean oven or the like), the heating time is 5 minutes to 5 hours (preferably 5 minutes to 3 hours and more preferably 5 minutes to one hour). However, when the heating treatment is performed using a pulse laser, the heating time may be set to about several femtoseconds.

Timing of the heating treatment may be right after formation of the semiconductor layer as the gate electrode or the active layer, right after patterning of the semiconductor layer, or after manufacturing of the transistor.

<Gate Electrode>

The gate electrode according to an aspect of the invention is a semiconductor where a carrier concentration is $1.0 \times 10^{14}/cm^3$ to $1.0 \times 10^{17}/cm^3$.

In the invention, the "carrier concentration" indicates a value that is obtained by measuring the Hall effect in a dark place at the room temperature (25° C.).

If the carrier concentration is less than $1.0 \times 10^{14}/cm^3$, the number of carriers becomes excessively small and a function as the gate electrode may deteriorate.

If the carrier concentration is more than $1.0 \times 10^{17}/cm^3$, it becomes difficult to maintain the depletion layer, the difference between the drain current at the time of irradiation and the drain current at the time of non-irradiation may become small (that is, a ratio of "a drain current at the time of irradiation to a drain current at the time of non-irradiation" may be approximately 1), and a function as the optical sensor may deteriorate.

The carrier concentration is preferably $1.0 \times 10^{15}/cm^3$ to $1.0 \times 10^{16}/cm^3$, in terms of maintenance of the function as the gate electrode and maintenance of the function as the optical sensor.

An example where the above description is experimentally confirmed is shown in the example 2 (refer to FIG. 8) to be described below.

The gate electrode according to an aspect of the invention is not particularly limited, as long as the gate electrode is a semiconductor where the carrier concentration is $1.0 \times 10^{14}/cm^3$ to $1.0 \times 10^{17}/cm^3$. Types of the gate electrode include a semiconductor substrate (n-type semiconductor substrate or p-type semiconductor substrate) having the above carrier concentration, a semiconductor region (n-type semiconductor region or p-type semiconductor region) having the above carrier concentration, which is formed in the semiconductor substrate, and a semiconductor layer (n-type semiconductor layer or p-type semiconductor layer) having the above carrier concentration, which is formed on a glass substrate.

As for the gate electrode according to an aspect of the invention, a semiconductor where the carrier concentration of the entire gate electrode is $1.0 \times 10^{14}/cm^3$ to $1.0 \times 10^{17}/cm^3$ may be satisfactory, and also may include substances other than the semiconductor.

Specific examples of the gate electrode include an n-type silicon substrate (n-Si substrate), an n-type silicon layer (n-Si layer), an n-type silicon region (n-Si region), a p-type silicon substrate (p-Si substrate), a p-type silicon layer (p-Si layer), a p-type silicon region (p-Si region), an n-type germanium substrate (n-Ge substrate), a p-type germanium substrate (p-Ge substrate), an n-type gallium arsenide substrate (n-GaAs substrate), and a p-type gallium arsenide substrate (p-GaAs substrate).

The n-type semiconductor substrate or the p-type semiconductor substrate may be formed by using a known method, such as a CZ method or an FZ method.

The n-type semiconductor region or the p-type semiconductor region may be formed by using a known method, such as ion implantation or ion doping.

The semiconductor layer that functions as the gate electrode may be formed by using a known method, such as plasma CVD or sputtering.

The semiconductor layer is preferably thick, from the point of light absorption or a resistance value. However, the semiconductor layer is preferably thin, from the point of an element structure and a manufacturing process (coverage or cost). The film thickness depends on the carrier amount or whether the film is amorphous or polycrystalline. However, the specific thickness is preferably 50 nm to 3 μm, more preferably 50 nm to 1 μm, and most preferably 100 nm to 500 nm.

The semiconductor layer may be patterned or not patterned.

The patterning may be performed by using a known method, such as a photo-etching method (method of patterning by photolithography and etching), a liftoff method (method of performing formation of a resist pattern, formation of a film, and removal of the resist pattern removal in this order) or a mask film-forming method (method of forming a film through a mask).

(Substrate)

As described above, the gate electrode may be a semiconductor layer that is provided on a substrate such as a glass substrate. Even when the optical sensor is configured as the top gate type transistor described above, a substrate is used.

As this substrate, a transparent substrate that has an insulating property (preferably, a volume resistivity is $10^{13}$ Ωcm or more) is preferably used.

In this case, the "transparent" means that an optical absorptance is 0.1 or less over the entire visible region (wavelength region of from 400 nm to 700 nm).

Specific examples of the substrate to be used include a glass substrate, a transparent film substrate made of polyethylene naphthalate (PEN), polyethylene terephthalate (PET), polycarbonate (PC) or polyimide (PI), an YSZ substrate, and a sapphire substrate.

The thickness of the substrate is preferably from 0.1 mm to 10 mm and more preferably from 0.15 mm to 1 mm, from the viewpoints of a light transmitting property and mechanical strength.

<Gate Insulating Film>

Preferably, the gate insulating film has an insulating property (preferably, volume resistivity is $10^{13}$ Ωcm or more) and heat resistance (preferably, the upper temperature limit is 500° C. or more).

Examples of the gate insulating film include insulating films made of $SiO_2$, $SiN_x$, $SiON$, $Al_2O_3$, $Y_2O_3$, $Ta_2O_5$, and $HfO_2$. Alternatively, the gate insulating film that contains at least two compounds among the above compounds may be used.

The gate insulating film may be formed according to a method that is appropriately selected from a wet-type method such as a printing method or a coating method, a physical method such as a vacuum deposition method, a sputtering method or an ion plating method, and a chemical method such as CVD or plasma CVD, in consideration of a suitability of the method for a material to be used.

The gate insulating film may be patterned or not patterned.

The patterning may be performed by using a known method, such as a photo-etching method, a liftoff method or a mask film-forming method.

The thickness of the gate insulating film is preferably from 5 nm to 3000 nm and more preferably from 5 nm to 300 nm, in terms of reduction of a current leak, a capacitance change obtained when the depletion layer is formed, and transparency.

As a specific example of formation of the gate insulating film, an insulating film made of silicon oxide ($SiO_2$), silicon nitride ($SiN_x$), or the like, which has a film thickness of from 5 nm to 300 nm is preferably formed by using a means, such as sputtering or CVD.

In the case in which the optical sensor according to an aspect of the invention is configured such that the light transmitted through the active layer and the gate insulating film is irradiated onto the gate electrode, it is preferable that the gate insulating film be transparent. Specifically, an optical absorptance of the gate insulating film is preferably 0.1 or less over the entire visible region (wavelength region of from 400 nm to 700 nm).

Thus, wavelength dependence of the sensitivity is further suppressed.

As the transparent gate insulating film having the transmittance described above, for example, a $SiO_2$ film having a thickness of from 100 nm to 400 nm is preferable.

<Active Layer>

The active layer according to an aspect of the invention is a semiconductor layer where a channel is formed by carriers of the same type as the gate electrode.

That is, when the gate electrode is an n-type semiconductor, the active layer is an n-type semiconductor layer where a channel is formed by electrons as a majority of carriers. When the gate electrode is a p-type semiconductor, the active layer is a p-type semiconductor layer where a channel is formed by holes as a majority of carriers.

The semiconductor layer serving as the active layer may be formed by using a known method, such as plasma CVD, sputtering, PLD, vacuum deposition, or ion plating.

The semiconductor layer may be patterned or not patterned.

The patterning may be performed by using a known method, such as a photo-etching (photolithography and etching) method, a liftoff method, or a mask film-forming method (method of forming a film through a mask).

The thickness of the semiconductor layer is preferably 30 nm to 2000 nm and more preferably 50 nm to 300 nm, to achieve the required drain current, transparency, and productivity.

Specific examples of the semiconductor layer include an amorphous silicon layer (a-Si layer), a polysilicon layer (poly-Si layer), an oxide semiconductor layer, a SiGe layer, and an organic semiconductor (pentacene or thiophene) layer.

Among them, an oxide semiconductor layer is preferable in terms of improvement of mobility and sensitivity as the optical sensor. The oxide semiconductor layer preferably includes at least one of In and Zn.

Specific examples of the oxide semiconductor layer that includes at least one of In or Zn include $In_2O_3$, ZnO, Indium Tin Oxide (ITO), and Indium Zinc Oxide (IZO).

Among them, an oxide semiconductor that contains at least one of In or Zn and at least one of Ga, Al, or Mg is preferable in terms of transparency and a semiconductor characteristic.

Examples of the "oxide semiconductor that contains at least one of In or Zn and at least one of Ga, Al, or Mg" include an oxide semiconductor (IGZO) containing In, Ga, and Zn, an oxide semiconductor containing In, Al, and Zn, an oxide semiconductor containing In, Ga, and Mg, and an oxide semiconductor containing Sc, Ga, and Zn.

The IGZO is generally represented by $In_{2-x}Ga_xO_3(ZnO)_m$ (however, $0 \leq x \leq 2$ and $0 < m$).

The IGZO according to an aspect of the invention may be a material system of $m \geq 2$. However, the IGZO according to an aspect of the invention is preferably a material system of $m=1$, from the viewpoint of an etching characteristic and a device characteristic. Strictly, the condition that In:Ga:Zn (atomic number ratio)=1:1:1 does not need to be satisfied. However, it is preferable that, when a composition ratio of In is set as 1, a ratio of Ga is 0.1 to 10 and a ratio of Zn is 0.1 to 10. An example of a ratio (atomic number ratio) of In:Ga:Zn (atomic number ratio) in terms of the number of atoms is 0.7:1.3:1.0. In the example of the composition ratio, a good sensor characteristic is shown at the time of irradiation with the light having a shorter wavelength, as compared with the case of In:Ga:Zn=1:1:1.

The composition ratio of the IGZO may be calculated by the RBS (Rutherford backscattering) analysis method or XRF (fluorescent X-ray analysis).

The IGZO film is preferably amorphous. It may be confirmed by an X-ray diffraction method that the IGZO film is amorphous.

The IGZO film is preferably formed by a vapor deposition method using a polycrystalline sintered compact of the IGZO as a target. Among the vapor deposition methods, a sputtering method and a pulse laser deposition method (PLD method) are more preferable and the sputtering method is most preferable, in terms of productivity.

The sputtering method may be a co-sputtering method using a combination of targets selected from an IGZO target, an $In_2O_3$ target, a $Ga_2O_3$ target, and a ZnO target.

When the optical sensor according to an aspect of the invention is configured such that the light transmitted through the active layer and the gate insulating film is irradiated onto the gate electrode, it is preferable that the active layer be transparent. Specifically, an optical absorptance is preferably 0.1 or less over the entire visible region (wavelength region of from 400 nm to 700 nm).

Thus, the wavelength dependence of the sensitivity is further suppressed.

Examples of the transparent active layer include an oxide semiconductor layer (IGZO film having a thickness of from 50 nm to 300 nm).

In the Si photodiode type optical sensor and the Si phototransistor type optical sensor according to the related art, incident light passes through a semiconductor layer made of silicon and an electrode layer before it reaches a depletion layer, and light (blue light) having a short wavelength is absorbed in these layers. For this reason, the sensitivity is lowered and the wavelength dependence of the sensitivity increases.

Meanwhile, when an active layer where an optical absorptance is 0.1 or less over the entire visible region (wavelength region of from 400 nm to 700 nm) is used as the active layer of the optical sensor according to an aspect of the invention, lowering of the sensitivity for the blue light is suppressed, and the wavelength dependence of the sensitivity is suppressed. For example, a change in a sensitivity in a region that has wavelengths of 400 nm to 700 nm (the change in a sensitivity is calculated by the following formula) is suppressed to 30% or less (for example, refer to an example 6, FIG. 15 and FIG. 16 to be described below).

Change in sensitivity(%)=((highest sensitivity−lowest sensitivity)/highest sensitivity)×100

Accordingly, when the optical sensor according to an aspect of the invention using the above active layer is used as an optical sensor for blue light in particular, the sensitivity may be notably improved. The optical sensor for the blue light may be configured by providing a blue color filter on the light incident side (on the active layer).

The optical sensor according to an aspect of the invention using the above active layer may be effectively used in manufacturing of an optical sensor array for a full color to be described below, because almost the same sensitivity is obtained with respect to blue light, red light, and green light and the wavelength dependence of the sensitivity is low.

<Source Electrode and Drain Electrode>

Examples of a material of the source electrode and the drain electrode according to an aspect of the invention include Al, an Al—Nd alloy, Mo, Au, Ti, ITO (indium tin oxide), IZO (indium zinc oxide), and alloys thereof. Each of the source electrode and the drain electrode may be a single film made of a metal or a metal alloy or a laminate of films laminated the single film (hereinafter, this form is collectively called a "metal film").

The thickness of the metal film is preferably from 10 nm to 1000 nm and more preferably from 50 nm to 500 nm, taking film-forming property, patterning based on etching or liftoff, and conductivity (low resistance) into account.

The source electrode and the drain electrode are manufactured by forming the metal film by sputtering or depositing and patterning the formed metal film using a photo-etching method.

The source electrode and the drain electrode may be formed by using a liftoff method or a mask film-forming method.

In this case, the source electrode and the drain electrode are preferably patterned to have overlapping portions with respect to the gate electrode and the active layer, when viewing the surface of each film in a normal direction (for example, refer to FIGS. 1 and 3).

<<Optical Sensor Array>>

The optical sensor array according to an aspect of the invention includes the plural optical sensors according to an aspect of the invention described above that are disposed in a matrix.

Since the optical sensor array according to an aspect of the invention is configured by disposing the plural optical sensors according to an aspect of the invention, each of which having a small element arrangement area, the optical sensors may be integrated with high density and a high-resolution image may be captured.

Examples of the optical sensor array according to an aspect of the invention include an optical sensor array including color filters (colored patterns) of a single color or plural colors (for example, three colors of red, blue, and green).

In this case, the color filter may be formed by a known method, such as a method that forms the color filter as a colored pattern by a photolithography method, using a color resist of each color.

Among examples of the optical sensor array with color filters, a preferable form of the optical sensor array includes a blue light-detecting optical sensor for detecting blue light, a blue color filter provided on the light incident side of the blue light-detecting optical sensor, a green light-detecting optical sensor for detecting green light, a green color filter provided on the light incident side of the green light-detecting optical sensor, a red light-detecting optical sensor for detecting red light, and a red color filter provided on the light incident side of the red light-detecting optical sensor in which the blue light-detecting optical sensor, the green light-detecting optical sensor, and the red light-detecting optical sensor are the optical sensors according to an aspect of the invention, and these optical sensors are disposed in a matrix. As arrangement of the optical sensors of respective colors, for example, known arrangement such as Bayer arrangement or honeycomb arrangement may be applied without a particular limitation.

According to the exemplary embodiment, a color image with high resolution may be captured with high sensitivity.

When the active layer of the optical sensor is configured to have an optical absorptance of 0.1 or less over the entire wavelength region of from 400 nm to 700 nm, the lowering of sensitivity is suppressed in the blue light-detecting optical sensor, and a sensitivity variation for every color is suppressed.

<<Optical Sensor Driving Method and Optical Sensor Array Driving Method>>

The optical sensor driving method according to an aspect of the invention is not limited in particular. For example, there may be used a method that applies a first bias (drain bias) between the source electrode and the drain electrode, applies a second bias (gate bias) to the gate electrode, measures a difference between values of currents flowing across the source electrode and the drain electrode between when light is irradiated and when the light is not irradiated (that is, difference between a drain current value at the time of irradiation and a drain current value at the time of non-irradiation), and detects an intensity of the light.

In this case, each of the first bias and the second bias may be a constant voltage or a pulsed voltage. However, a combination where the first bias is the constant voltage and the second bias is the pulsed voltage is preferably configured.

According to this combination, timing of light irradiation and timing at which a drain current increases can be matched with each other (for example, refer to an example 3 (FIG. 10)).

That is, according to this combination, it may be observed in real time whether light is irradiated, and light detection may be repeated in a short time.

The reason why the timing of light irradiation and the timing at which a drain current increases can be matched with each other by the combination is presumed as follows. However, the invention is not limited by the following presumption.

That is, when the gate voltage $V_g$ is applied with the constant voltage (DC), the inversion layer created by the holes generated by the light irradiation is maintained even after the light irradiation ends. For this reason, it is presumed that the increased drain current is maintained even after the light irradiation ends.

Meanwhile, when the gate voltage $V_g$ is applied in the pulse form, a band is flat when a pulse signal is not applied (in this case, 0 V is applied), and the depletion layer may disappear. As a result, the holes that have created the inversion layer may be released. For this reason, it is assumed that the increased drain current returns to an original value, after the light irradiation ends.

In this case, the pulse width of the second bias is preferably $1.0 \times 10^{-3}$ seconds or more, from the viewpoint of improvement of sensitivity (increase in a drain current per unit intensity of the irradiation light).

Figure 14:
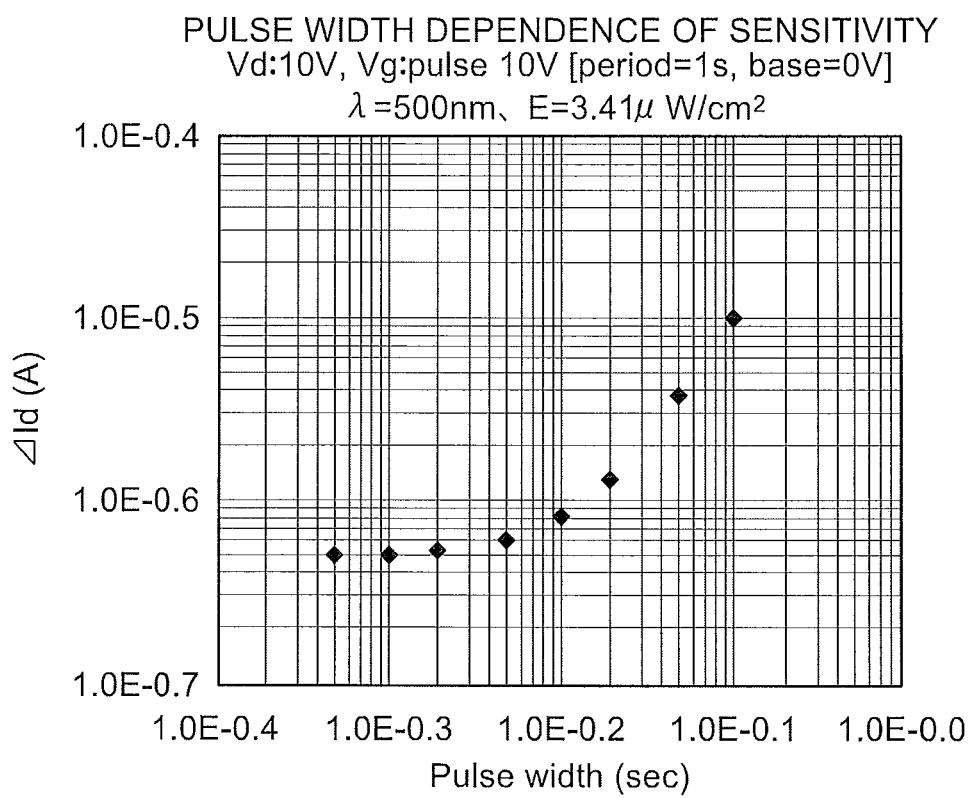
FIG. 14 is a graph illustrating an example of a drain current for each pulse width.

The pulse width is more preferably $1.0 \times 10$ seconds to $1.0 \times 10^{-1}$ seconds and most preferably $1.0 \times 10^{-2}$ seconds to $1.0 \times 10^{-1}$ seconds (for example, refer to an example 5 and FIG. 14).

In this case, when the pulse width is decreased, the sensitivity is lowered. However, a measurement range may be widely taken (for example, refer to the example 5 and "w=0.02 s" of FIG. 13).

Meanwhile, when the pulse width is increased, the sensitivity is increased. Therefore, this is advantageous in detecting weak light (for example, refer to the example 5 and "w=0.1 s" of FIG. 13).

A voltage that corresponds to a linear region of the transistor is preferably applied as the first bias and the second bias. Thus, the drain current may be increased according to a linear function, with respect to the intensity of the irradiation light. Therefore, light detection with high precision may be achieved (for example, refer to an example 4 and FIG. 11).

Also, a voltage that corresponds to a saturation region of the transistor is preferably applied as the first bias and the second bias. Thus, since the sensitivity improves and the drain current of a wide range may be obtained, the light detection in a wide measurement range may be performed (for example, refer to the example 4 and FIG. 12).

As the optical sensor driving method according to an aspect of the invention, a combination of the plural driving methods may be applied to a single optical sensor.

For example, when the intensity of measured light is unclear, a high-quality image may be captured by continuously applying gate pulses having the different pulse widths (for example, a gate bias of $1.0 \times 10^{-3}$ seconds or more and a gate bias of less than $1.0\times10^{-3}$ seconds) to a single optical sensor, appropriately adjusting a measurement range or sensitivity, and measuring the intensity of the light.

The optical sensor array driving method according to an aspect of the invention is not particularly limited. However, a driving method may be a method in which the optical sensor driving methods according to the exemplary embodiments are appropriately combined.

In this way, since sensitivity or precision may be adjusted for each element (optical sensor), a high-quality image may be captured.

For example, it is preferable to configure a combination in which, to the element (optical sensor) of the optical sensor array that is required to have good sensitivity, at least one method of a method of setting the pulse width of the second bias to $1.0\times10^{-3}$ seconds or more and a method of applying a voltage corresponding to a saturation region of the transistor as the first bias and the second bias is applied, and, to the element (optical sensor) that is required to have high requiring precision, a method of applying a voltage corresponding to a linear region of the transistor as the first bias and the second bias is applied.

EXAMPLES

Hereinafter, the present invention will be specifically described with reference to examples. However, the invention is not limited to examples.

When a transistor characteristic (drain current) is measured, a semiconductor parameter analyzer (trade name: 4156C, manufactured by Agilent Technologies) is used.

In an experiment of light irradiation, a sample is disposed in a dark place (black box) and measurement is performed while monochrome light is irradiated, using an optical fiber. The monochrome light having a desired wavelength and intensity is obtained by using a Xe lamp as a light source and using a monochromator, a band-pass filter, and a concentration gradient ND filter.

Example 1

Confirmation of a Capacitance Change Due to Light

Figure 4A:
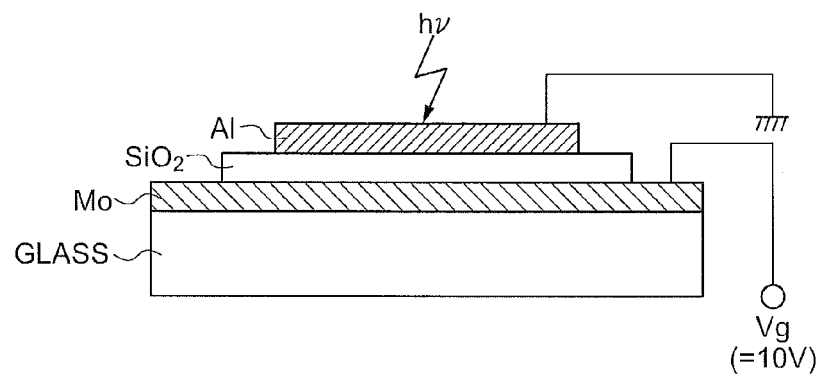
FIGS. 4A, 4B, 4C, and 4D are schematic cross-sectional views of a capacitor having an "Al/SiO$_2$/Mo" structure, a capacitor having an "(Al/)IGZO/SiO$_2$/Mo" structure, a capacitor having an "Mo/SiO$_2$/n-Si" structure, and a capacitor having an "(Al/)IGZO/SiO$_2$/n-Si" structure, respectively.
Figure 4B:
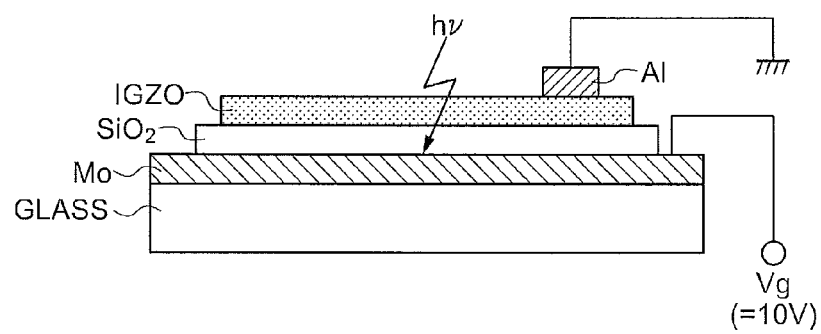
Figure 4C:
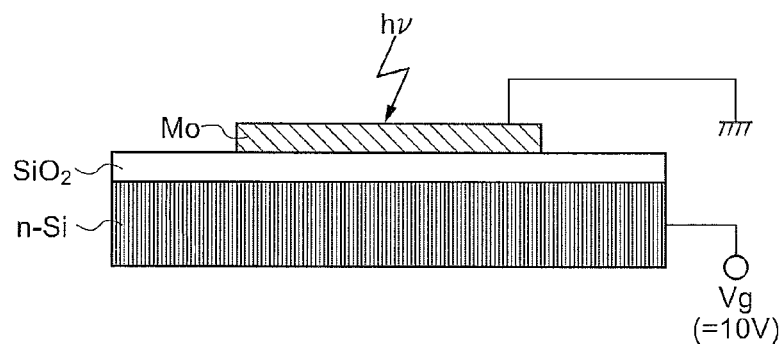
Figure 4D:
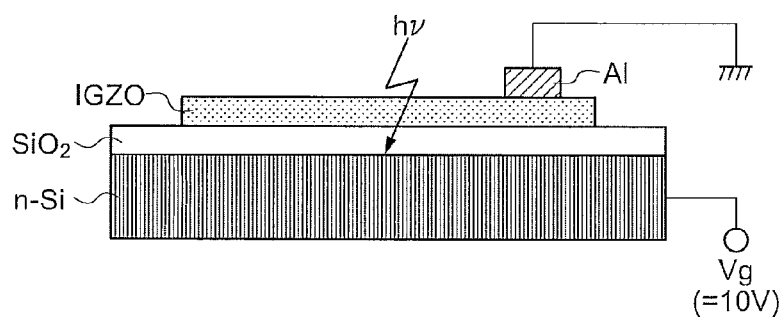
Figure 5:
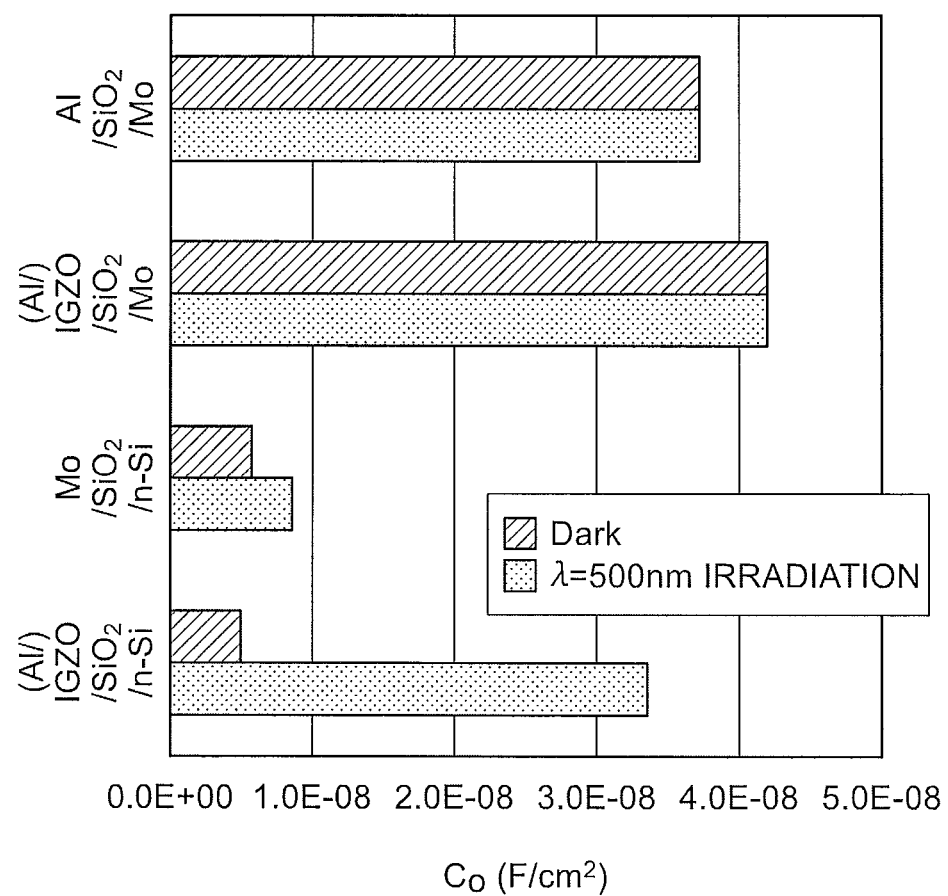
FIG. 5 is a graph illustrating a change in capacitance which is caused by light irradiation for each of the capacitor structures shown in FIGS. 4A, 4B, 4C, and 4D.

In order to verify that the gate capacitance of the optical sensor 100 shown in FIG. 1 changes due to light irradiation, a capacitance change based on light irradiation was measured with respect to the capacitors of the individual structures shown in FIG. 4A to 4D (measurement result is shown in FIG. 5).

Hereinafter, the capacitor of each structure will be described in detail and the measurement result of the capacitance change based on the light irradiation will be described.

<Capacitor having a "Al/SiO$_2$/Mo" Structure (FIG. 4A)>

FIG. 4A is a schematic cross-sectional view of a capacitor having an "Al/SiO$_2$/Mo" structure.

The capacitor having the "Al/SiO$_2$/Mo" structure has a structure in which an Mo film which is a lower electrode (electrode on the side close to the substrate, which is applicable to the following description), an SiO$_2$ film which is an insulating film, and an Al electrode (electrode on the side away from the substrate, which is applicable to the following description) which are an upper electrode are provided in this order.

The capacitor having the "Al/SiO$_2$/Mo" structure was manufactured as follows.

First, a Mo film having a thickness of about 100 nm was formed on a glass substrate (synthesis quartz substrate (trade name: VIOSIL, manufactured by Shin-Etsu Quartz Products Co., Ltd.: thickness is 0.525 mm)) by sputtering, and a SiO$_2$ film having a thickness of about 100 nm was formed by sputtering. In this case, the SiO$_2$ film was formed by mask-sputtering such that a portion of the Mo film which is a base film is exposed.

Next, an Al film having a thickness of about 300 nm was formed on the SiO$_2$ film by sputtering and the capacitor having the "Al/SiO$_2$/Mo" structure was obtained. In this case, the Al film was formed by mask-sputtering to be fit into a region where the SiO$_2$ film was formed.

<Capacitor Having a "(Al/)IGZO/SiO$_2$/Mo" Structure (FIG. 4B)>

FIG. 4B is a schematic cross-sectional view of a capacitor having a "(Al/)IGZO/SiO$_2$/Mo" structure.

The capacitor having the a "(Al/)IGZO/SiO$_2$/Mo" structure has a structure in which an Mo film which is a lower electrode, an SiO$_2$ film which is an insulating film, an IGZO film which is an upper electrode, and an Al electrode for applying a voltage to the upper electrode are provided on a glass substrate.

The capacitor having the "(Al/)IGZO/SiO$_2$/Mo" structure was manufactured as follows.

First, a Mo film having a thickness of about 100 nm was formed on a synthesis quartz substrate (trade name: VIOSIL, manufactured by Shin-Etsu Quartz Products Co., Ltd.: thickness is 0.525 mm)) by sputtering, and a SiO$_2$ film having a thickness of about 100 nm was formed by sputtering. In this case, the SiO$_2$ film is formed by mask-sputtering such that a portion of the Mo film which is a base film is exposed.

Next, an IGZO film (In:Ga:Zn [atomic number ratio]=1.0:1.0:1.0) was formed on the SiO$_2$ film by sputtering. The sputtering for the IGZO film was executed under the following conditions, using an IGZO target, a Ga$_2$O$_3$ target, and a ZnO target.

~Sputtering Conditions for IGZO Film (In:Ga:Zn [Atomic Number Ratio]=1.0:1.0:1.0)~

Arrival vacuum degree (at the time of not introducing gas): $6\times10^{-6}$ Pa

Film formation pressure (at the time of introducing gas): $4.07\times10^{-1}$ Pa Film formation temperature: room temperature (substrate temperature of 23° C. to 25° C.)

Ar flow rate: 100 sccm

O$_2$ flow rate: 0.9 sccm

Power supplied to IGZO target: RF 200 W

Power supplied to Ga$_2$O$_3$ target: RF 63 W

Power supplied to ZnO target: DC 4.3 W

The IGZO film was formed by mask-sputtering to be fit into a region where the SiO$_2$ film is formed.

Next, an Al electrode having a thickness of about 300 nm was formed on the IGZO film by a sputtering method and a liftoff method, and thus the capacitor having the "(Al/)IGZO/SiO$_2$/Mo" structure was obtained.

In this capacitor, as shown in FIG. 4B, the IGZO film is exposed in a portion other than the patterned Al film, and light may be irradiated onto the Mo film through the IGZO film and the SiO$_2$ film.

<Capacitor Having a "Mo/SiO$_2$/n-Si" Structure (FIG. 4C)>

FIG. 4C is a schematic cross-sectional view of a capacitor having a "Mo/SiO$_2$/n-Si" structure.

The capacitor having the "Mo/SiO$_2$/n-Si" structure has a structure in which a SiO$_2$ film which is an insulating film and a Mo film which is an upper electrode are provided on an n-Si substrate in this order.

The capacitor having the "Mo/SiO$_2$/n-Si" structure was manufactured as follows.

First, an n-Si substrate (manufactured by SUMCO CORPORATION, having resistivity of 30 Ω·cm and carrier concentration of $1.5 \times 10^{14}/cm^3$) was prepared.

Next, a SiO$_2$ film having a thickness of about 100 nm was formed on the n-Si substrate by thermal oxidation, and the SiO$_2$ film on a rear surface was removed by using buffered hydrofluoric acid.

Next, a Mo film having a thickness of about 100 nm was formed on a SiO$_2$ film by sputtering, and the "Mo/SiO$_2$/n-Si" structure was obtained. In this case, the Mo film was formed by mask-sputtering to be fit into a region where the SiO$_2$ film is formed.

<Capacitor Having an "(Al/)IGZO/SiO$_2$/n-Si" Structure (FIG. 4D)>

FIG. 4D is a schematic cross-sectional view of a capacitor having an "(Al/)IGZO/SiO$_2$/n-Si" structure.

The capacitor having the "(Al/)IGZO/SiO$_2$/n-Si" structure has a structure in which a SiO$_2$ film which is an insulating film, an IGZO film which is an upper electrode, and an Al electrode for applying a voltage to the upper electrode are provided on an n-Si substrate which is a lower electrode.

That is, the capacitor having the "(Al/)IGZO/SiO$_2$/n-Si" structure has a structure that corresponds to a laminated structure of the active layer 16/the gate insulating film 12/the gate electrode 10 in the optical sensor 100.

The capacitor having the "(Al/)IGZO/SiO$_2$/n-Si" structure was manufactured as follows.

A SiO$_2$ film having a thickness of about 100 nm was formed on the n-Si substrate used in manufacturing the capacitor having the "(Al/)IGZO/SiO$_2$/n-Si" structure by thermal oxidation, and the SiO$_2$ film on a rear surface was removed by using buffered hydrofluoric acid.

Next, an IGZO film and an Al electrode are formed in this order on the SiO$_2$ film using the same method as manufacturing the capacitor having the "(Al/)IGZO/SiO$_2$/Mo" structure.

In this way, the capacitor having the "(Al/)IGZO/SiO$_2$/n-Si" structure was obtained.

<Measurement of a Capacitance Change Due to Light Irradiation>

With respect to the capacitors having the individual structures shown in FIGS. 4A to 4D, measurement of the capacitance in a dark place (Dark) and measurement of the capacitance at the time of irradiation (λ=500 nm) were performed.

In the measurement of the capacitance, the capacitance (unit F/cm$^2$) of when a voltage of +10 V is applied to a lower electrode or a Si substrate was calculated from a QSCV (Quasi-Static CV) curve by using a semiconductor parameter analyzer (trade name: 4156C, manufactured by Agilent Technologies) and was set as $C_0$.

The measurement of the capacitance at the time of irradiation was performed in a state where light having a wavelength of 500 nm (irradiation light intensity of 10 μW/cm$^2$) is irradiated from the upper electrode to the lower electrode (light hν of FIGS. 4A to 4D).

In FIGS. 4A and 4C, since the upper electrode is a metal film (Al or Mo), the upper electrode does not transmit the light hν and the light hν does not reach the lower electrode.

FIG. 5 is a graph illustrating a measurement result of the capacitance $C_0$ of the capacitor of each structure shown in FIGS. 4A to 4D.

A vertical axis of the graph shown in FIG. 5 shows the structure of the capacitor and a horizontal axis shows the capacitance of the capacitor.

In FIG. 5, in regards to a numerical value of $C_0$, a symbol "E" represents that a next numerical value is a "power index" using 10 as a bottom and a numerical value represented by "E" and "power index" is multiplied with a numerical value before "E". For example, a notation of "2.0E-08" represents "$2.0 \times 10^{-8}$". This is the same in graphs to be described below.

As shown in FIG. 5, in the "Al/SiO$_2$/Mo" structure and the "(Al/)IGZO/SiO$_2$/Mo" structure, since a lower electrode is a metal film, the capacitance is not lowered by light irradiation.

In the "Mo/SiO$_2$/n-Si" structure (Dark), it is confirmed that the capacitance is greatly decreased as compared with the "Al/SiO$_2$/Mo" structure (Dark) and the "(Al/)IGZO/SiO$_2$/Mo" structure (Dark). The decrease in the capacitance shows that the depletion layer is generated near the interface with the SiO$_2$ film of the n-Si. That is, the capacitance changes as if the thickness of the insulating film increases by formation of the depletion layer. In the "Mo/SiO$_2$/n-Si" structure, since the electrode of the light irradiation side is a metal (Mo), the capacitance is rarely increased by light irradiation.

Also, in "(Al/)IGZO/SiO$_2$/n-Si" structure (Dark), it is confirmed that the capacitance was greatly decreased as compared with the "Al/SiO$_2$/Mo" structure (Dark) and the "(Al/)IGZO/SiO$_2$/Mo" structure (Dark). The decrease in the capacitance shows that the depletion layer is generated near the interface with SiO$_2$ of the n-Si.

It is confirmed that the capacitance is greatly increased (recovered) by light irradiation, only in "(Al/)IGZO/SiO$_2$/n-Si" structure. The recovery of the capacitance shows that the inversion layer is generated near the interface with the SiO$_2$ film of the depletion layer.

From the result of the "(Al/)IGZO/SiO$_2$/n-Si" structure, a phenomenon of the gate capacitance of the optical sensor 100 shown in FIG. 1 being changed by light irradiation is experimentally confirmed.

Example 2

Vg-Id Characteristic of an Optical Sensor (Transistor of an n-Si Gate)

<Manufacture of an Optical Sensor (Transistor of an n-Si Gate)>

As the optical sensor (transistor of an n-Si gate), the optical sensor 100 shown in FIG. 1 was manufactured as follows.

First, an n-Si substrate (manufactured by SUMCO, having carrier concentration of $1.0 \times 10^{16}/cm^3$) was prepared as the gate electrode 10, and the SiO$_2$ film functioning as the gate insulating film 12 and the IGZO film were formed on the n-Si substrate functioning as the gate electrode 10 in this order, in the same way as manufacturing of the capacitor having the "(Al/)IGZO/SiO$_2$/n-Si" structure.

Next, the formed IGZO film was processed in the active layer 16 corresponding to an island pattern, by means of photolithography and wet etching using dilute sulfuric acid.

Next, a pair of Al electrodes having a thickness of 300 nm are formed on the active layer 16 and the gate insulating film 12 by a sputtering method and a liftoff method, and the source electrode 14S and the drain electrode 14D were formed. In this case, the source electrode 14S and the drain electrode 14D were manufactured such that the channel length (L) of the transistor becomes 200 μm and the channel width becomes 600 μm.

Next, using a clean oven, the heat treatment was performed on the n-Si substrate formed the source electrode 14S and the drain electrode 14D at the temperature of 500° C. for 0.5 hour.

In this way, the optical sensor 100 shown in FIG. 1 was obtained.

<Vg-Id Characteristic of an Optical Sensor (Transistor of an n-Si Gate)>

With respect to the obtained optical sensor 100, the gate bias Vg applied to the gate electrode 10 was changed in a state where a drain bias (Vd) of 10 V (constant voltage) is applied to the drain electrode 14D, and the drain current Id in each Vg was measured (Vg-Id characteristic). The source electrode 14S was connected to a ground, in all examples including examples to be described below.

Specifically, a DC bias functioning as the gate bias was applied while being increased by 0.25 V and the drain current Id in each voltage value was measured.

A Vg-Id characteristic was measured in each environment of a dark place (Dark) and light irradiation ($\lambda$=500 nm).

The measurement of the Vg-Id characteristic at the time of irradiation ($\lambda$=500 nm) was performed in a state where light (light irradiation intensity of 10 $\mu W/cm^2$) having a wavelength of 500 nm is irradiated from the outside of the active layer 16 to the optical sensor 100 (that is, a state where light is irradiated onto the gate electrode 10 through the active layer 16 and the gate insulating film 12) (refer to light hv of FIG. 1).

The light irradiation direction is the same in the following examples.

Figure 6:
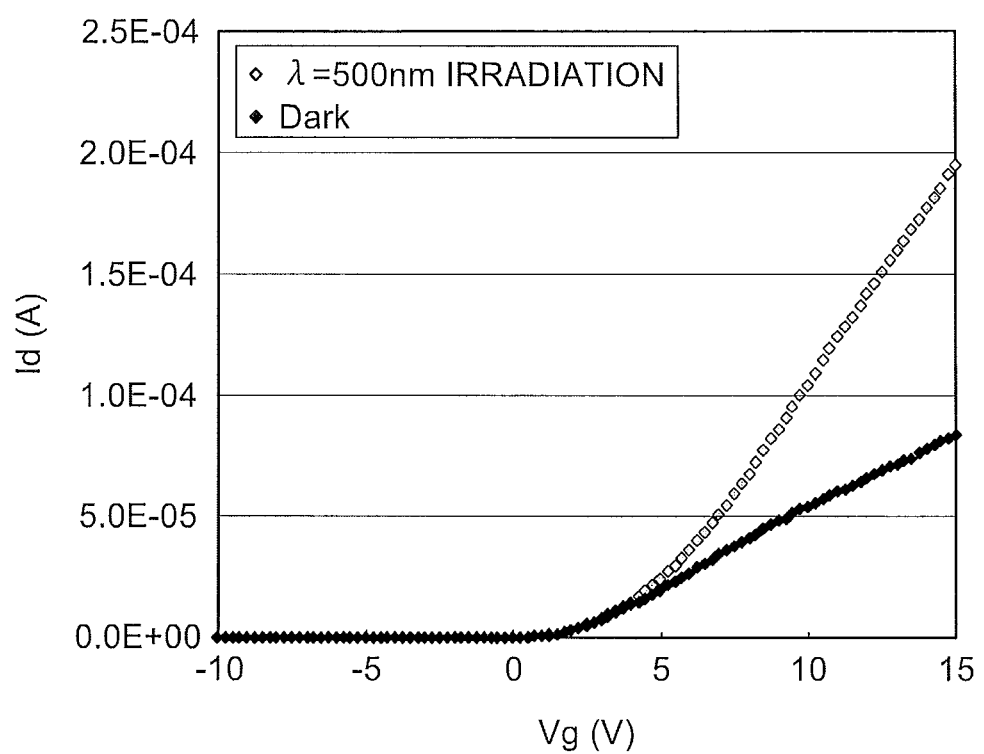
FIG. 6 is a graph illustrating a Vg-Id characteristic of an optical sensor according to an example 2.

The measurement result of the Vg-Id characteristic is shown in FIG. 6.

As shown in FIG. 6, the drain current Id at the time of Vg=10 V is approximately doubled by the light irradiation.

From the above result, an increase in the drain current Id due to the light irradiation is confirmed and it is confirmed that the optical sensor 100 (transistor) functions as an optical sensor.

Vg-Id Characteristic of a Transistor of a Metal Gate (Comparative Test)

As the comparative example with respect to the optical sensor (transistor of the n-Si gate), a transistor of a metal gate was manufactured and then a Vg-Id characteristic of the transistor was measured.

That is, in regard to the manufacture of the optical sensor 100, the transistor of the metal gate was manufactured in the same way as manufacturing of the optical sensor 100, except that, instead of using the n-Si substrate, a substrate in which a Mo film is sputtered on a glass substrate was used (that is, the gate insulating film, the active layer, and the source electrode and the drain electrode were formed on the Mo film).

With respect to the obtained transistor of the metal gate, a Vg-Id characteristic was measured by the same method as the Vg-Id characteristic of the optical sensor 100.

Figure 7:
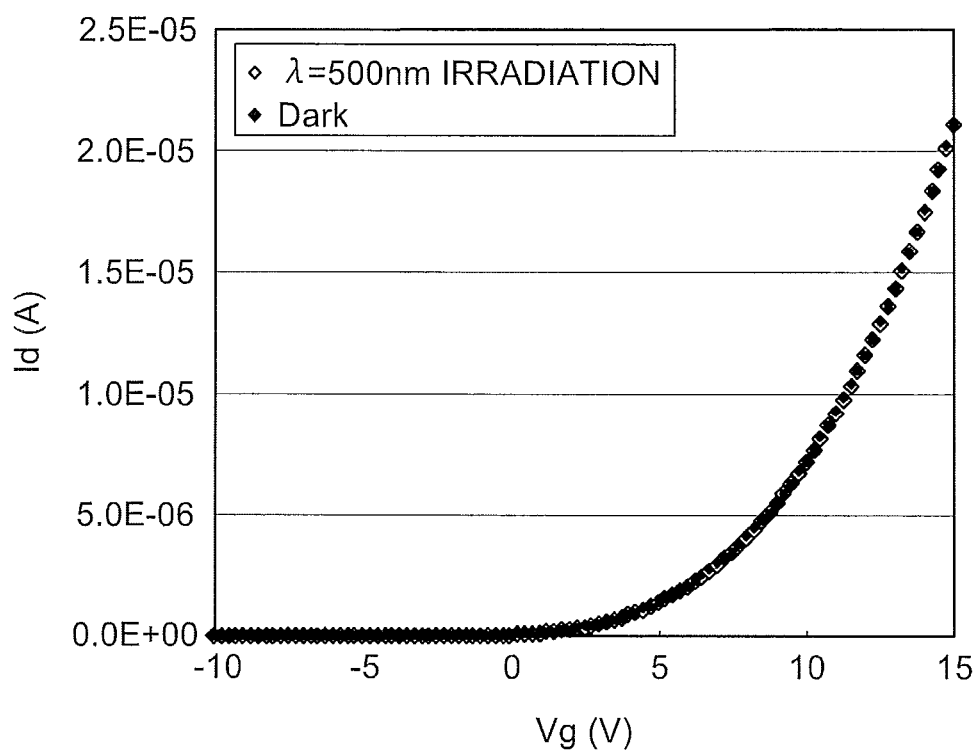
FIG. 7 is a graph illustrating a Vg-Id characteristic of a transistor of a metal gate.

The measurement result of the Vg-Id characteristic is shown in FIG. 7.

As shown in FIG. 7, it may be seen that the increase in the drain current Id due to the light irradiation is not confirmed and the transistor of the metal gate does not function as the optical sensor.

<Evaluation of Gate Carrier Concentration Dependence of an Id Variation>

Figure 8:
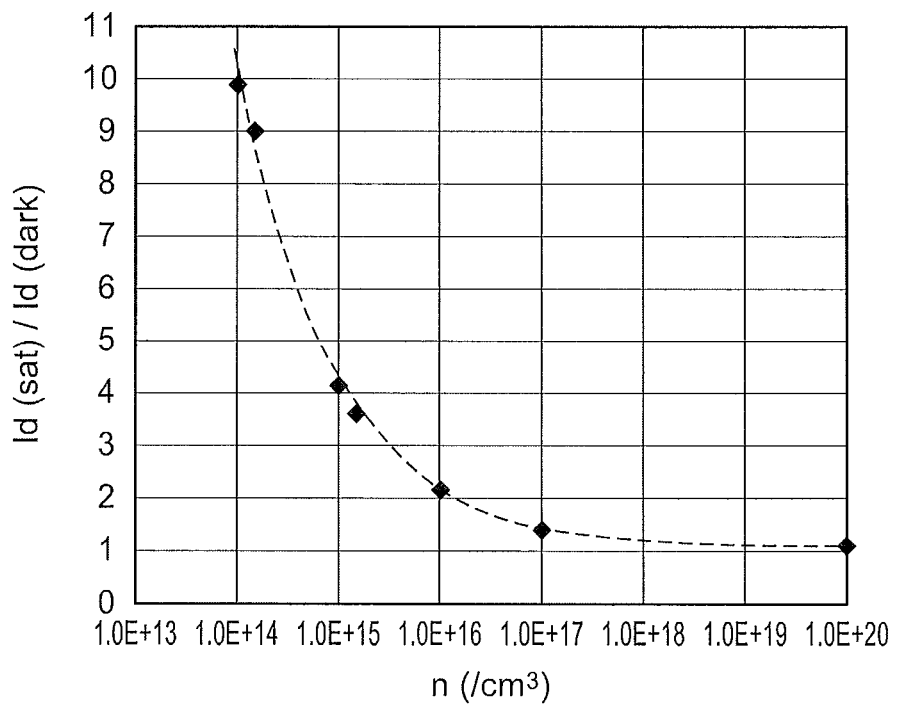
FIG. 8 is a graph illustrating an example of gate carrier concentration dependence of an Id variation.

Next, the gate carrier concentration in the optical sensor 100 was variously changed and the Id variation was measured (refer to FIG. 8). In this case, the Id variation indicates a ratio [Id (sat)/Id (dark)] of Id (hereinafter, referred to as "Id (dark)") in a dark place and Id (hereinafter, referred to as "Id (sat)") of when light having the sufficient intensity is irradiated and a variation is saturated.

Under the measurement conditions of the Id variation in which Vg is 10 V (fixed), Vd is 10 V, the wavelength of the irradiation light is 500 nm, and the irradiation intensity is 10 $\mu W/cm^2$, the drain current before irradiation is calculated as Id (dark) and the drain current after 20 seconds from a light irradiation start is calculated as Id (sat).

The gate carrier concentration is changed by preparing plural silicon substrates where the impurity concentration is changed and manufacturing individual transistors.

The gate carrier concentration is evaluated by measuring a Hall effect in a dark place.

FIG. 8 is a graph illustrating an Id variation "Id (sat)/Id (dark)" with respect to each gate carrier concentration n.

As shown in FIG. 8, it is confirmed that "Id (sat)/Id (dark)" has a value greater than 1 in a range of $1.0 \times 10^{14}/cm^3$ to $1.0 \times 10^{17}/cm^3$, so that it may be used as the optical sensor (that is, light detection is performed using an increase in the drain current due to the light irradiation).

Example 3

Evaluation of Gate Bias Application Method
Dependence of a Drain Current

With respect to each of the case where the gate bias is a constant voltage using the optical sensor 100 manufactured in the example 2 (refer to FIG. 9) and the case where the gate bias is a pulsed voltage (FIG. 10), the drain current of when light is irradiated and the drain currents before and after the light is irradiated were measured.

<Change in Drain Current in the Case where the Gate Bias is a Constant Voltage>

First, a temporal change of the drain current was measured in a state where the source electrode 14S of the optical sensor 100 is connected to a ground, a drain bias (Vd) of 10 V (constant voltage) is applied to the drain electrode 14D, and a gate bias (Vg) of 10 V (constant voltage) is applied to the gate electrode 10.

Specifically, the following light was irradiated for five seconds and a change in the drain current when the light is irradiated and before and after the light is irradiated is measured. In this case, light (illumination light intensity of 8.5 $\mu W/cm^2$) having the wavelength of 500 nm was used as the irradiated light.

Figure 9:
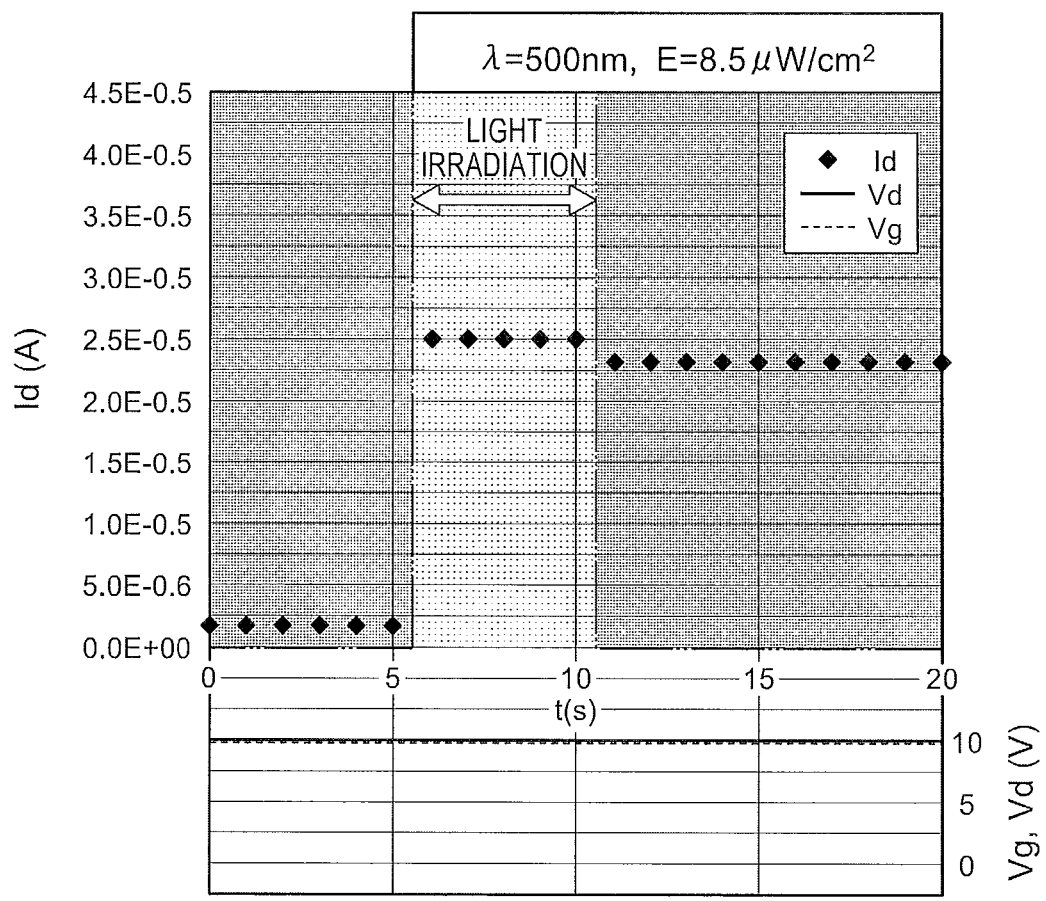
FIG. 9 is a graph illustrating an example of drain currents, when light is irradiated, before and after the irradiation, in the case where a gate bias is a constant voltage.

FIG. 9 is a graph illustrating a temporal change of a drain current when an observation start time is 0 second. In FIG. 9, a longitudinal axis of the left side is an axis that shows a drain current value, a longitudinal axis of the right side is an axis that shows a gate bias value and a drain bias value, and a horizontal axis shows an observation time (this is same in case of FIG. 10 to be described below).

As shown in FIG. 9, the drain current Id was increased by light irradiation (between 6 seconds and 11 seconds from an observation start). Even after the light irradiation (11 seconds after the observation start), the increased drain current Id was hardly decreased. That is, even after the light irradiation ends, information of the irradiated light intensity is stored.

<Change in Drain Current in the Case where the Gate Bias is a Pulsed Voltage>

The change in the drain current in the case where the gate bias is a pulsed voltage was measured in the same way as the "case where the gate bias is a constant voltage", except that the gate bias is a pulsed voltage having the pulse width of 0.1 second (pulsed voltage of a minimum value of 0 V and a maximum value of 10 V).

Figure 10:
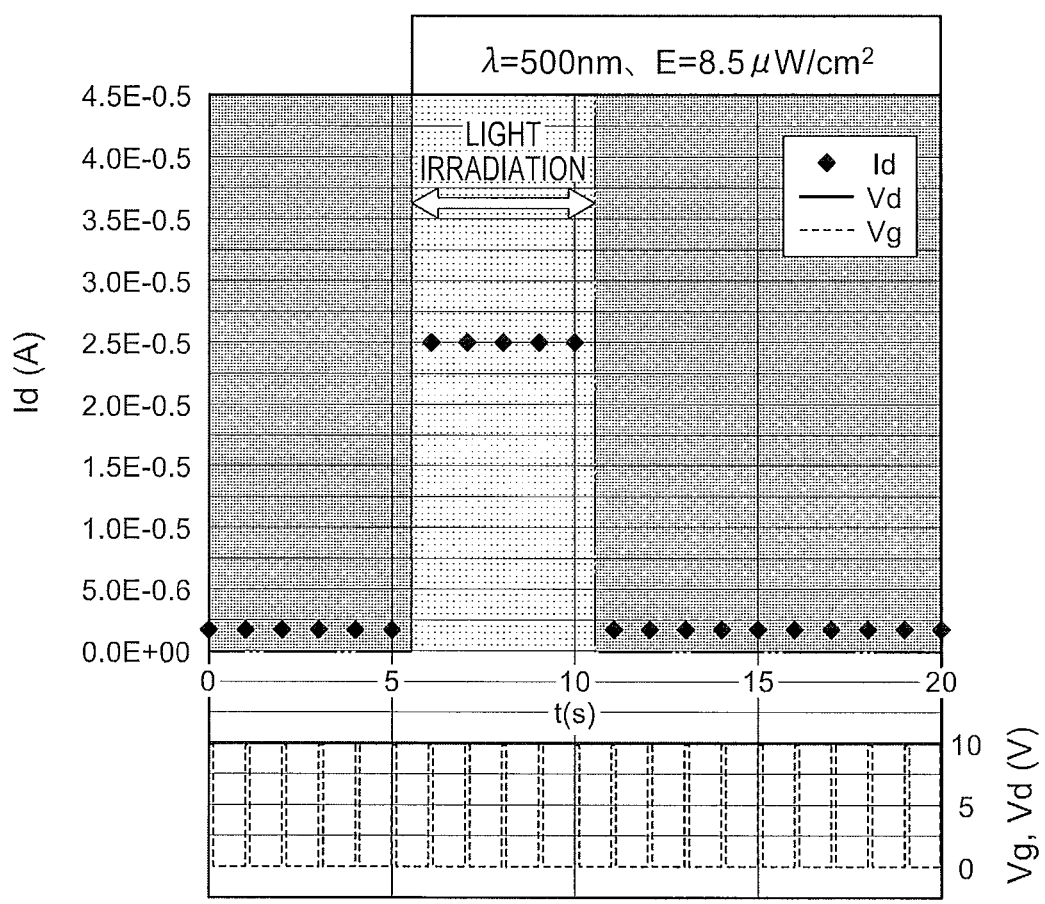
FIG. 10 is a graph illustrating an example of drain currents, when light is irradiated, before and after the irradiation, in the case where a gate bias is a pulsed voltage.

FIG. 10 is a graph illustrating a temporal change of a drain current when an observation start time is 0 second. As shown in FIG. 10, the drain current Id is increased by light irradiation (between 6 seconds and 10 seconds from an observation start). Even after the light irradiation (11 seconds after the observation start), the increased drain current Id is returned to the original value.

Through the above test, it is confirmed that the timing of the light irradiation and the timing of the drain current increase may be matched by applying the pulsed voltage as the gate bias.

That is, it is confirmed that it may be observed in real time whether the light is irradiated and light detection may be repeated in a short time, by applying the pulsed voltage as the gate bias.

When the change in the drain current due to the light irradiation was measured in each of the case where the gate bias is a constant voltage and the gate bias is a pulsed voltage, in the same way as the above case, except that the wavelength of the light is 700 nm, the same effect as the above case was obtained.

That is, when the pulsed voltage was applied as the gate bias, the timing of the light irradiation and the timing of the drain current increase could be matched without depending on the wavelength of the light.

Example 4

Change in Drain Current with Respect to Irradiation Light Intensity

<Measurement in a Linear Region of a Transistor>

Figure 11:
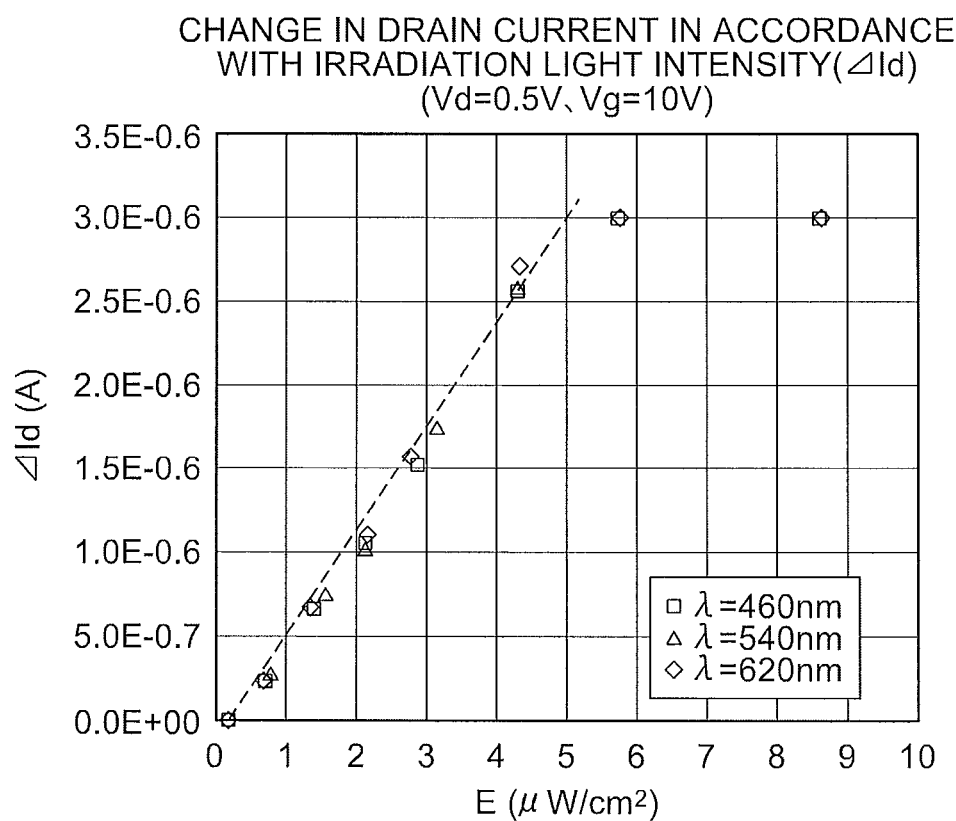
FIG. 11 is a graph (transistor linear region) illustrating an example of changes in drain current in accordance with the intensity of irradiated light.

A change in the drain current with respect to the irradiation light intensity in the linear region of the transistor was measured using the optical sensor 100 manufactured in the example 2 (refer to FIG. 11).

First, the source electrode 14S of the optical sensor 100 was connected to a ground, the drain bias of 0.5 V (constant voltage) corresponding to the linear region of the transistor was applied to the drain electrode 14D, and the pulsed voltage of 10 V (maximum value: 10 V and minimum value: 0 V) having the pulse width of 0.1 s was applied as the gate bias Vg to the gate electrode 10.

In this state, the change in the drain current with respect to the light irradiation intensity was measured.

The change in the drain current was measured with respect to the case where each of light having wavelengths of 460 nm, 540 nm, and 620 nm was irradiated.

FIG. 11 is a graph illustrating changes (linear region of a transistor) in the drain current in accordance with the irradiation light intensity.

In FIG. 11, a horizontal axis is an axis that shows irradiation light intensity E ($\mu$W/cm$^2$) by a linear axis (linear scale) and a longitudinal axis shows a variation $\Delta$Id (A) of the drain current by a linear axis (linear scale).

As shown in FIG. 11, even when each of light having the wavelengths of 460 nm, 540 nm, and 620 nm was used, the drain current increased according to a linear function as the irradiation light intensity increased, and the drain current was saturated at the irradiation light intensity of 5 $\mu$W/cm$^2$ to 6 $\mu$W/cm$^2$.

As the result of the above test, in a system where a drain bias corresponding to the linear region of the transistor was applied, the drain current increases according to the linear function in accordance with the irradiation light intensity. Therefore, sensitivity was constant by the light intensity and light detection with high precision could be simply performed.

<Measurement in a Saturation Region of a Transistor>

Figure 12:
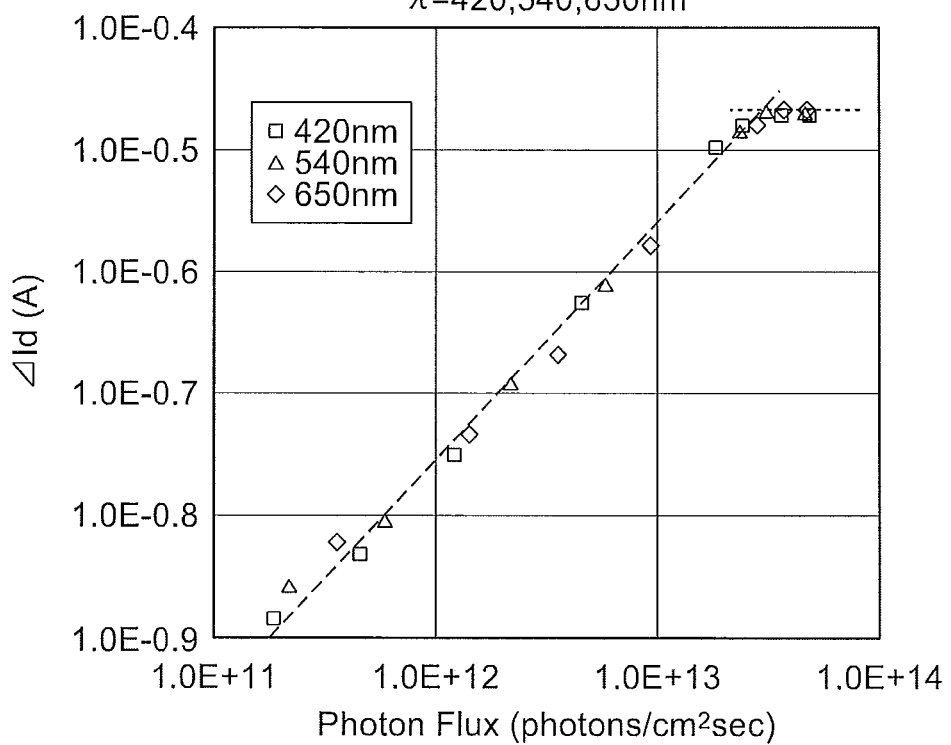
FIG. 12 is a graph (transistor saturation region) illustrating an example of changes in drain current in accordance with the intensity of irradiated light.

Except that the composition ratio of the active layer of the optical sensor was changed to In:Ga:Zn=0.7:1.3:1.0, the heat treatment temperature was changed to 180° C., the drain bias was changed to 10 V (drain bias corresponding to the saturation region of the transistor), and the wavelength of the irradiated light was changed to each of the wavelengths of 420 nm, 540 nm, and 650 nm in the "measurement in the linear region of the transistor, the change in the drain current with respect to a photon flux in the saturation region of the transistor was measured in the same way as the "measurement in the linear region of the transistor" (refer to FIG. 12).

FIG. 12 is a graph illustrating changes (saturation region) in the drain current in accordance with the irradiation light intensity.

In FIG. 12, a horizontal axis is an axis that shows a photon flux by a logarithmic axis (log scale) and a longitudinal axis shows a variation $\Delta$Id (A) of the drain current by a logarithmic axis (log scale).

The photon flux is a value that is calculated by the irradiation light intensity.

As shown in FIG. 12, even when each of light having the wavelengths of 420 nm, 540 nm, and 650 nm was used, the drain current increased as the photon flux increased. The drain current showed a value in a wide range of $1\times10^{-9}$ (A) to $1\times10^{-5}$ (A).

As the result of the above test, in a system where a drain bias corresponding to the saturation region of the transistor was applied, sensitivity was high and the drain current in a wide range could be obtained. Therefore, light detection of a wide measurement range could be performed.

Example 5

Evaluation of the Pulse Width of a Gate Bias

Except that the wavelength of the irradiated light was changed to 500 nm, a change in the drain current in accordance with the irradiation light intensity was measured in the same way as "measurement in the linear region of the transistor" of the example 4 (pulse width of the gate bias: 0.1 s).

Next, except that the wavelength of the irradiated light was changed to 500 nm and the pulse width of the gate bias was changed to 0.02 s, a change $\Delta$Id in the drain current in accordance with the irradiation light intensity E was measured in the same way as "measurement in the linear region of the transistor" of the example 4 (pulse width of the gate bias: 0.02 s).

Figure 13:
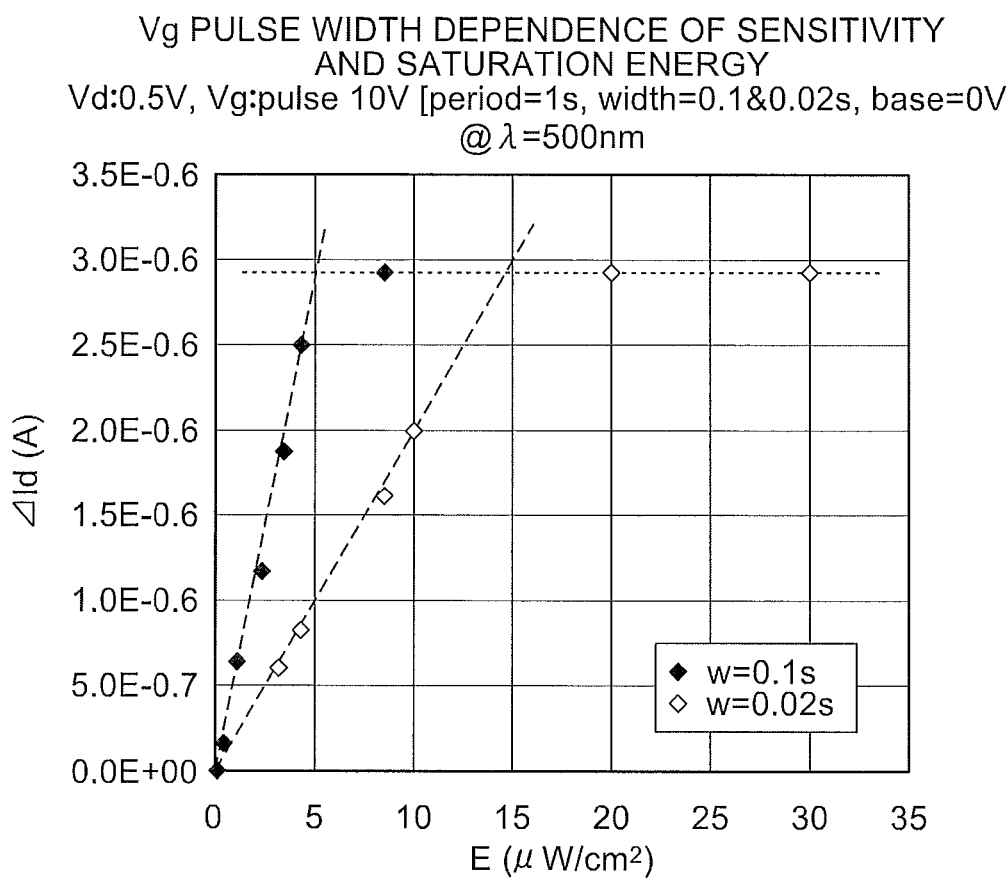
FIG. 13 is a graph illustrating an example of changes (pulse width: 0.1 seconds and 0.02 seconds) in drain current in accordance with the intensity of irradiated light.

FIG. 13 is a graph illustrating changes $\Delta$Id in the drain current in accordance with the irradiation light intensity in each of the cases where the pulse widths of the gate bias are 0.1 s and 0.02 s.

As shown in FIG. 13, when the pulse width of the gate bias is set to 0.1 s (w=0.1 s), the inclination of Id with respect the irradiation light intensity was relatively large and sensitivity was high. That is, the case where the pulse width of the gate bias is 0.1 s is useful when light is detected with high sensitivity.

As shown in FIG. 13, when the pulse width of the gate bias is set to 0.02 s (w=0.02 s), the inclination of Id with respect the irradiation light intensity was relatively small. Even when light with the large intensity is irradiated, it is difficult to saturate Id. That is, the case where the pulse width of the gate bias is 0.02 s is useful when light of a wide intensity range is detected.

Next, except that the irradiation light intensity was fixed to 3.41 $\mu$W/cm$^2$ and the pulse width of the gate bias was variously changed, the drain current in accordance with each pulse width was measured in the same way as the above case (refer to FIG. 14). When the drain current increases, the sensitivity becomes high.

In a graph of FIG. 14, a horizontal axis shows the pulse width and a vertical axis shows a variation in the drain current.

As shown in FIG. 14, when the pulse width was improved to $1\times10^{-13}$ or more, the drain current increases and sensitivity was improved.

Example 6

Evaluation of Wavelength Dependence of Sensitivity

<Optical Absorptances of Each Film>

An amorphous IGZO film (a-IGZO film), an amorphous silicon film (a-Si film), and a polysilicon film (poly-Si film) were formed on the glass substrate used in the example 1, and samples for measuring optical absorptances of each film were manufactured. The thickness of all films was 50 nm.

In addition, film formation conditions of each film are as follows.

~a-IGZO Film~

The film formation conditions of the a-IGZO film are the same as those of the example 1.

~a-Si Film~

Ar-diluted silane gas was used as a raw material and the film was formed by CVD at the substrate temperature of 430° C. under a pressure of 145 Pa.

~Poly-Si Film~

After dehydrogenation treatment was performed on the a-Si film at the temperature of 480° C. under the pressure of 800 Pa, the film was formed by XeCl excimer laser irradiation (laser beam having the pulse width of 30 nsec and the energy density of 350 mJ/cm² was scanned to be 20 times irradiated onto the same place with a frequency of 300 Hz).

The optical absorptances of each film (a-IGZO film, a-Si film, and poly-Si film) were measured using the manufactured samples for measuring optical absorptances. When the optical absorptances were measured, spectrophotometers (trade names: U3310 and U4000, manufactured by Hitachi in Japan) were used.

Figure 15:
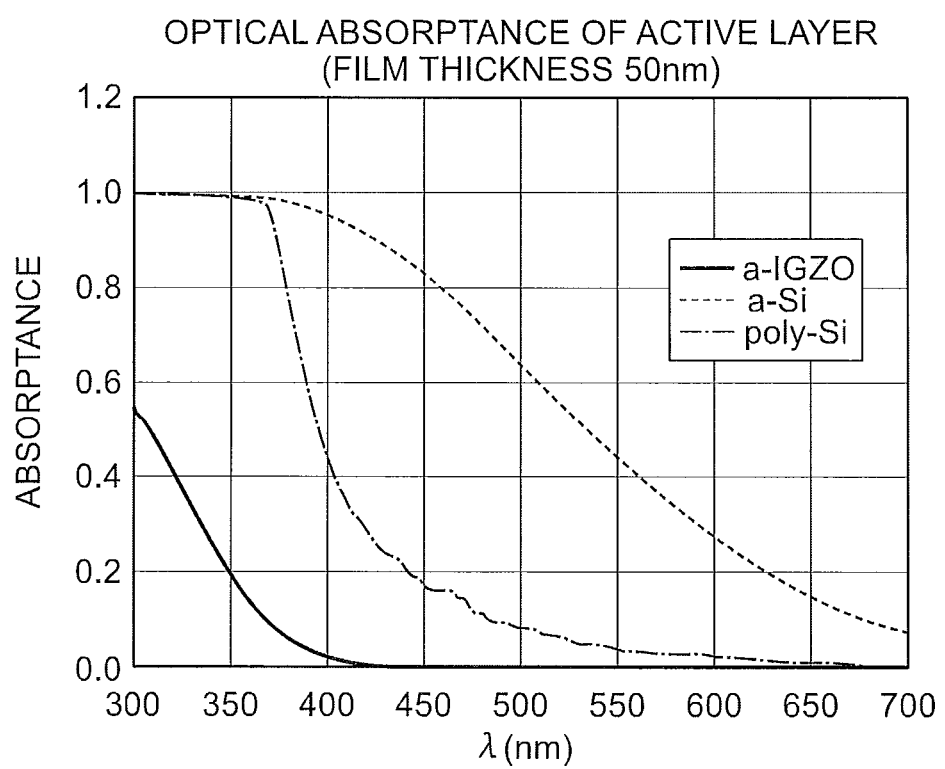
FIG. 15 is a graph illustrating an example of optical absorptances of an a-IGZO film, an a-Si film, and a poly-Si film.

FIG. 15 is a graph illustrating examples of optical absorptances of an a-IGZO film, an a-Si film, and a poly-Si film.

In a graph of FIG. 15, a horizontal axis shows the wavelength $\lambda$ of light and a vertical axis shows the optical absorptances.

As shown in FIG. 15, light is absorbed over a visible region (region where the wavelengths are 400 nm to 700 nm) in the a-Si film. In particular, when the wavelength is shorter, the optical absorptance was larger.

In the poly-Si film, the optical absorptance was large in particular in a region where the wavelength is 500 nm or less.

With respect to this result in the a-IGZO film, light absorption over a visible region (region where the wavelengths are 400 nm to 700 nm) was rarely confirmed.

From the above result, it was confirmed that light may be detected with high sensitivity over the visible region (region where the wavelengths are 400 nm to 700 nm), when the a-IGZO film was used as the active layer 16 of the sensor 100.

In particular, it was confirmed that detection sensitivity of blue light (for example, wavelengths of 400 nm to 450 nm) was high when the a-IGZO film was used as the active layer 16 of the sensor 100, as compared with when the a-Si film or the poly-Si film was used as the active layer.

<Wavelength Dependence of Sensitivity>

Next, the wavelength dependence of the sensitivity was measured with respect to each of the optical sensor 100, an optical sensor 101 where the combination ratio of the IGZO film of the optical sensor 100 was changed to (In:Ga:Zn (atomic number ratio)=0.7:1.3:1) and the heat treatment temperature was changed to 180° C., and an optical sensor for comparison corresponding an Si phototransistor.

The sputtering conditions for the IGZO film (In:Ga:Zn (atomic number ratio)=0.7:1.3:1.0) of the optical sensor 101 are as follows.

~Sputtering Conditions for the IGZO Film (In:Ga:Zn (Atomic Number Ratio)=0.7:1.3:1.0)~

The sputtering conditions are the same as the sputtering conditions for the IGZO film (In:Ga:Zn (atomic number ratio)=1.0:1.0:1.0) of the example 1, except that the supplied power is changed to the following power.

Power supplied to an IGZO target: RF 140 W
Power supplied to a $Ga_2O_3$ target: RF 400 W
Power supplied to a ZnO target: DC 7.3 W As the optical sensor for comparison, a phototransistor (trade name: ST-1CL3H, manufactured by KODENSHI CORP.) was used.

The sensitivity is an increase in the Id per unit irradiation intensity under conditions of Vg=10 V and Vd=10V.

The relative sensitivity(%) is a relative value of when a maximum value of the sensitivity in the sensor is set as 100%.

Figure 16:
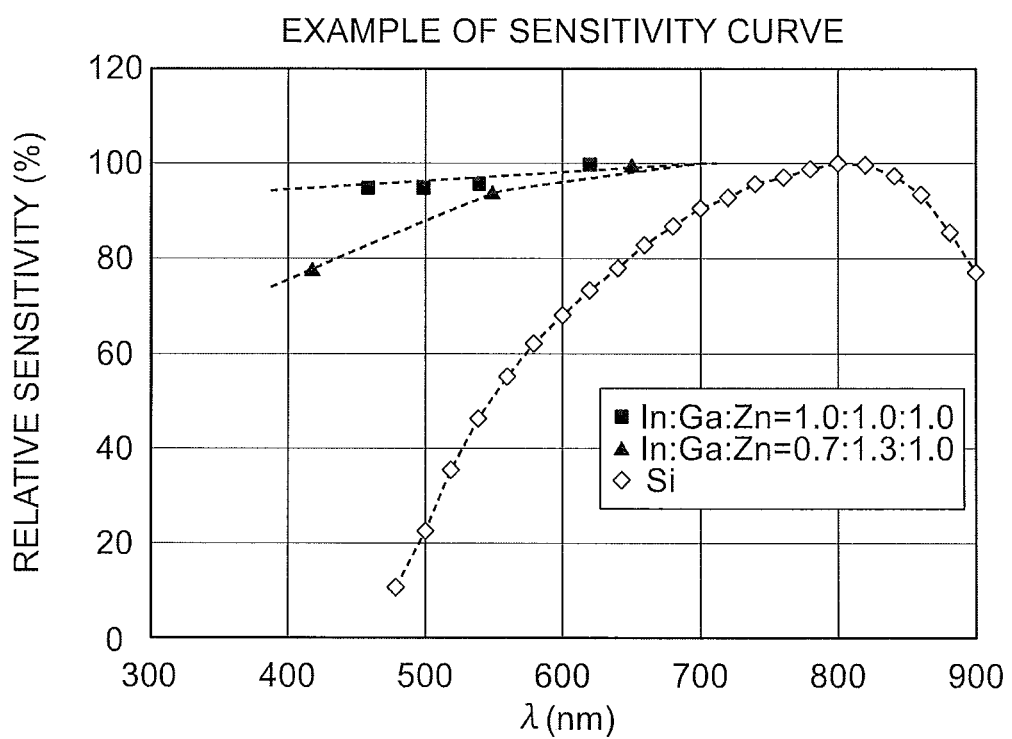
FIG. 16 is a graph illustrating an example of relative sensitivity(%) for each wavelength.

FIG. 16 is a graph illustrating an example of relative sensitivity(%) for each wavelength.

As shown in FIG. 16, in the optical sensor for comparison that is the Si phototransistor, when the wavelength decreased, the relative sensitivity decreased, in a visible region (region where the wavelengths are 400 nm to 700 nm).

Meanwhile, in the optical sensor 101 (In:Ga:Zn (atomic number ratio)=0.7:1.3:1.0), a change in the sensitivity that is represented by the following formula was suppressed to about 25% in the visible region.

Change in sensitivity(%)=((highest sensitivity−lowest sensitivity)/highest sensitivity)×100

In the optical sensor 100 (In:Ga:Zn (atomic number ratio) =1.0:1.0:1.0), a change in the sensitivity was suppressed to about 5 to 10% in the visible region.

As such, in the optical sensor 100 and the optical sensor 101, the change in the sensitivity in the region having the wavelength of 400 nm to 700 nm was suppressed to 30% or less, and wavelength dependence of the sensitivity was suppressed. Specifically, the sensitivity in the blue light was particularly suppressed from being lowered, as compared with the conventional optical sensor.

The invention includes the following exemplary embodiments.

(1) An optical sensor that is a transistor which includes a gate electrode comprising a semiconductor material having a carrier concentration of from $1.0\times10^{14}/cm^3$ to $1.0\times10^{17}/cm^3$, an active layer comprising a semiconductor layer to form a channel by carriers of the same type as the gate electrode, a source electrode, a drain electrode, and a gate insulating film, wherein intensity of irradiated light is detected by a change in a value of current flowing between the source electrode and the drain electrode when the light is irradiated onto a depletion layer formed at the gate electrode.

(2) The optical sensor of (1), wherein the light that is irradiated onto the depletion layer is light that is transmitted through the active layer and the gate insulating film.

(3) The optical sensor of (1) or (2), wherein a majority of carriers of the gate electrode are electrons and the active layer is an oxide semiconductor layer that includes at least one of In or Zn.

(4) The optical sensor of (3), wherein the oxide semiconductor layer further includes at least one of Ga, Al, or Mg.

(5) The optical sensor of any one of (1) to (4), wherein an optical absorptance of the active layer is 0.1 or less over a wavelength region of from 400 nm to 700 nm.

(6) The optical sensor of (1), wherein the semiconductor layer of the gate electrode that has a thickness of from 50 nm to 3 μm.
(7) The optical sensor of (1), wherein the gate insulating film comprises a $SiO_2$ film that has a thickness of from 100 nm to 400 nm.
(8) The optical sensor of any one of (1) to (7), wherein a change in a sensitivity of the optical sensor in a wavelength region of from 400 nm to 700 nm is 30% or less.
(9) The optical sensor of any one of (1) to (8), wherein a blue color filter is provided on a light incident side of the optical sensor.
(10) An optical sensor array that includes a plurality of optical sensors according to any one of (1) to (9), wherein the plurality of optical sensors are disposed in a matrix.
(11) An optical sensor array, comprising: a blue light-detecting optical sensor that detects blue light; a blue color filter that is provided on a light incident side of the blue light-detecting optical sensor; a green light-detecting optical sensor that detects green light; a green color filter that is provided on a light incident side of the green light-detecting optical sensor; a red light-detecting optical sensor that detects red light; and a red color filter that is provided on a light incident side of the red light-detecting optical sensor, wherein the blue light-detecting optical sensor, the green light-detecting optical sensor, and the red light-detecting optical sensor are each an optical sensor according to any one of (1) to (9) and are disposed in a matrix.
(12) An optical sensor driving method that drives the optical sensor of any one of (1) to (9), comprising: applying a first bias between the source electrode and the drain electrode; applying a second bias which is a pulsed voltage to the gate electrode; and detecting intensity of irradiated light by measuring a difference between values of currents flowing between the source electrode and the drain electrode, when the light is irradiated and when the light is not irradiated.
(13) The optical sensor driving method of (12), wherein each of the first bias and the second bias is a voltage that corresponds to a linear region of the transistor.
(14) The optical sensor driving method of (12), wherein each of the first bias and the second bias is a voltage that corresponds to a saturation region of the transistor.
(15) The optical sensor driving method of any one of (12) to (14), wherein a pulse width of the second bias is $1.0 \times 10^{-3}$ seconds or more.
(16) An optical sensor driving method in which a plurality of optical sensor driving methods of any one of (12) to (15) are combined.
(17) An optical sensor array driving method that drives the optical sensor array of (10) or (11), and an optical sensor array driving method that is configured by combining plural optical sensor driving methods of any one of (12) to (15).

All publications, patent applications, and technical standards mentioned in this specification are herein incorporated by reference to the same extent as if each individual publication, patent application, or technical standard was specifically and individually indicated to be incorporated by reference.

What is claimed is:

1. An optical sensor that is a transistor which comprises a gate electrode comprising a semiconductor material having a carrier concentration of from $1.0 \times 10^{14}/cm^3$ to $1.0 \times 10^{17}/cm^3$, an active layer comprising a semiconductor layer to form a channel by carriers of the same type as the gate electrode, a source electrode, a drain electrode, and a gate insulating film, wherein intensity of irradiated light is detected by a change in a value of current flowing between the source electrode and the drain electrode when the light is irradiated onto a depletion layer formed at the gate electrode.

2. The optical sensor of claim 1, wherein the light that is irradiated onto the depletion layer is light that is transmitted through the active layer and the gate insulating film.

3. The optical sensor of claim 1, wherein a majority of carriers of the gate electrode are electrons, and the active layer is an oxide semiconductor layer that includes at least one of In or Zn.

4. The optical sensor of claim 3, wherein the oxide semiconductor layer further includes at least one of Ga, Al, or Mg.

5. The optical sensor of claim 1, wherein an optical absorptance of the active layer is 0.1 or less over a wavelengths region of from 400 nm to 700 nm.

6. The optical sensor of claim 1, wherein the semiconductor layer of the gate electrode has a thickness of from 50 nm to 3 μm.

7. The optical sensor of claim 1, wherein the gate insulating film comprises a $SiO_2$ film that has a thickness of from 100 nm to 400 nm.

8. The optical sensor of claim 1, wherein a change in a sensitivity of the optical sensor in a wavelength region of from 400 nm to 700 nm is 30% or less.

9. The optical sensor of claim 1, wherein a blue color filter is provided on a light incident side of the optical sensor.

10. An optical sensor array that includes a plurality of optical sensors according to claim 1, wherein the plurality of optical sensors are disposed in a matrix.

11. An optical sensor array comprising:
a blue light-detecting optical sensor that detects blue light;
a blue color filter that is provided on a light incident side of the blue light-detecting optical sensor;
a green light-detecting optical sensor that detects green light;
a green color filter that is provided on a light incident side of the green light-detecting optical sensor;
a red light-detecting optical sensor that detects red light; and
a red color filter that is provided on a light incident side of the red light-detecting optical sensor,
wherein the blue light-detecting optical sensor, the green light-detecting optical sensor, and the red light-detecting optical sensor are each an optical sensor according to claim 1 and are disposed in a matrix.

12. An optical sensor driving method that drives the optical sensor of claim 1, comprising:
applying a first bias between the source electrode and the drain electrode;
applying a second bias which is a pulsed voltage to the gate electrode; and
detecting intensity of irradiated light by measuring a difference between values of currents flowing between the source electrode and the drain electrode, when the light is irradiated and when the light is not irradiated.

13. The optical sensor driving method of claim 12, wherein each of the first bias and the second bias is a voltage that corresponds to a linear region of the transistor.

14. The optical sensor driving method of claim 12, wherein each of the first bias and the second bias is a voltage that corresponds to a saturation region of the transistor.

15. The optical sensor driving method of claim 12, wherein a pulse width of the second bias is $1.0 \times 10^{-3}$ seconds or more.

16. An optical sensor driving method in which a plurality of optical sensor driving methods according to claim 12 are combined.

17. An optical sensor array driving method that drives the optical sensor array of claim 10, comprising:
- applying a first bias between the source electrode and the drain electrode;
- applying a second bias which is a pulsed voltage to the gate electrode; and
- detecting intensity of irradiated light by measuring a difference between values of currents flowing between the source electrode and the drain electrode, when the light is irradiated and when the light is not irradiated.

18. An optical sensor array driving method that drives the optical sensor array of claim 11, comprising:
- applying a first bias between the source electrode and the drain electrode;
- applying a second bias which is a pulsed voltage to the gate electrode; and
- detecting intensity of irradiated light by measuring a difference between values of currents flowing between the source electrode and the drain electrode, when the light is irradiated and when the light is not irradiated.

* * * * *